United States Patent [19]
Sadler et al.

[11] Patent Number: 5,941,444
[45] Date of Patent: Aug. 24, 1999

[54] SOLDERING

[75] Inventors: Steven P. Sadler, Billerica; Patrizio Vinciarelli, Boston, both of Mass.

[73] Assignee: VTL Corporation, San Antonio, Tex.

[21] Appl. No.: 08/931,913

[22] Filed: Feb. 24, 1997

Related U.S. Application Data

[62] Division of application No. 08/640,018, Apr. 30, 1996, Pat. No. 5,642,850, which is a division of application No. 08/420,553, Apr. 11, 1995, Pat. No. 5,560,537.

[51] Int. Cl.$^6$ .............................. B23K 3/00; B23K 37/00
[52] U.S. Cl. .............................. 228/33; 228/43; 228/49.5
[58] Field of Search .............................. 228/33, 43, 44.7, 228/49.5, 212; 118/500, 503, 729; 156/566; 269/903; 29/832, 840

[56] References Cited

U.S. PATENT DOCUMENTS

| | | | |
|---|---|---|---|
| 3,482,755 | 12/1969 | Raciti | 228/34 |
| 3,565,319 | 2/1971 | Eschenbrucher | 228/37 |
| 4,283,847 | 8/1981 | May | 29/832 |
| 4,363,434 | 12/1982 | Flury | 228/37 X |
| 4,569,473 | 2/1986 | Guiliano | 228/37 X |
| 4,720,034 | 1/1988 | Lee | 228/37 |
| 4,832,250 | 5/1989 | Spigarelli et al. | 228/102 |
| 4,916,807 | 4/1990 | Wiese | 29/840 |
| 5,148,961 | 9/1992 | Humbert et al. | 228/37 |
| 5,176,312 | 1/1993 | Lowenthal | 228/180.1 |

FOREIGN PATENT DOCUMENTS

| | | |
|---|---|---|
| 0621101A1 | 10/1994 | European Pat. Off. |
| 3730434 A1 | 9/1988 | Germany . |
| 48-5644 | 1/1973 | Japan . |
| 61-82764 | 5/1986 | Japan . |
| 63-140763 | 6/1988 | Japan . |
| 3-155465 | 7/1991 | Japan . |
| 3-76658 | 7/1991 | Japan . |
| 4-59169 | 2/1992 | Japan .............................. B23K 3/00 |
| 4-59170 | 2/1992 | Japan . |
| 4-59171 | 2/1992 | Japan . |
| 4-200861 | 7/1992 | Japan . |
| 5-245626 | 9/1993 | Japan . |
| 6-304744 | 11/1994 | Japan . |
| 8-46339 | 2/1996 | Japan . |
| 1102621 | 7/1968 | United Kingdom . |
| 2245508 | 1/1992 | United Kingdom . |

OTHER PUBLICATIONS

AIRVAC Engineering, Co., Inc, PCBRM12 Printed Circuit Board Reflow Systems for Desoldering and Selectively Soldering Thru–Hole Multi–Leaded Components.
WENESCO, Inc., Wenesco Brochure.
Balog et al., "Surface–Mount Component Soldering", U.S. Serial No. 08/225,263, filed Aug., 1994, assigned to VLT Corporation, now abandoned.
Pullen et al., "Packaging Electrical Components", U.S. Serial No. 08/337,245, filed Nov. 10, 1994, assignedt to VLT Corporation, now USPN 5,644,103.

*Primary Examiner*—Samuel M. Heinrich
*Attorney, Agent, or Firm*—Fish & Richardson P.C.

[57] ABSTRACT

The invention features soldering parts (e.g., printed circuit boards) by indexing the parts sequentially and continuously through a series of processing stations. Each of the series of processing stations includes at least one processing position, and the indexer indexes the parts from processing position to processing position. At different processing stations, the parts indexed into those processing stations are simultaneously processed.

4 Claims, 25 Drawing Sheets

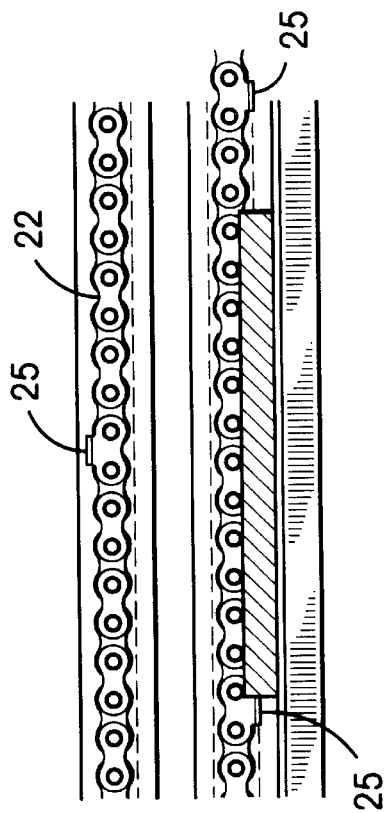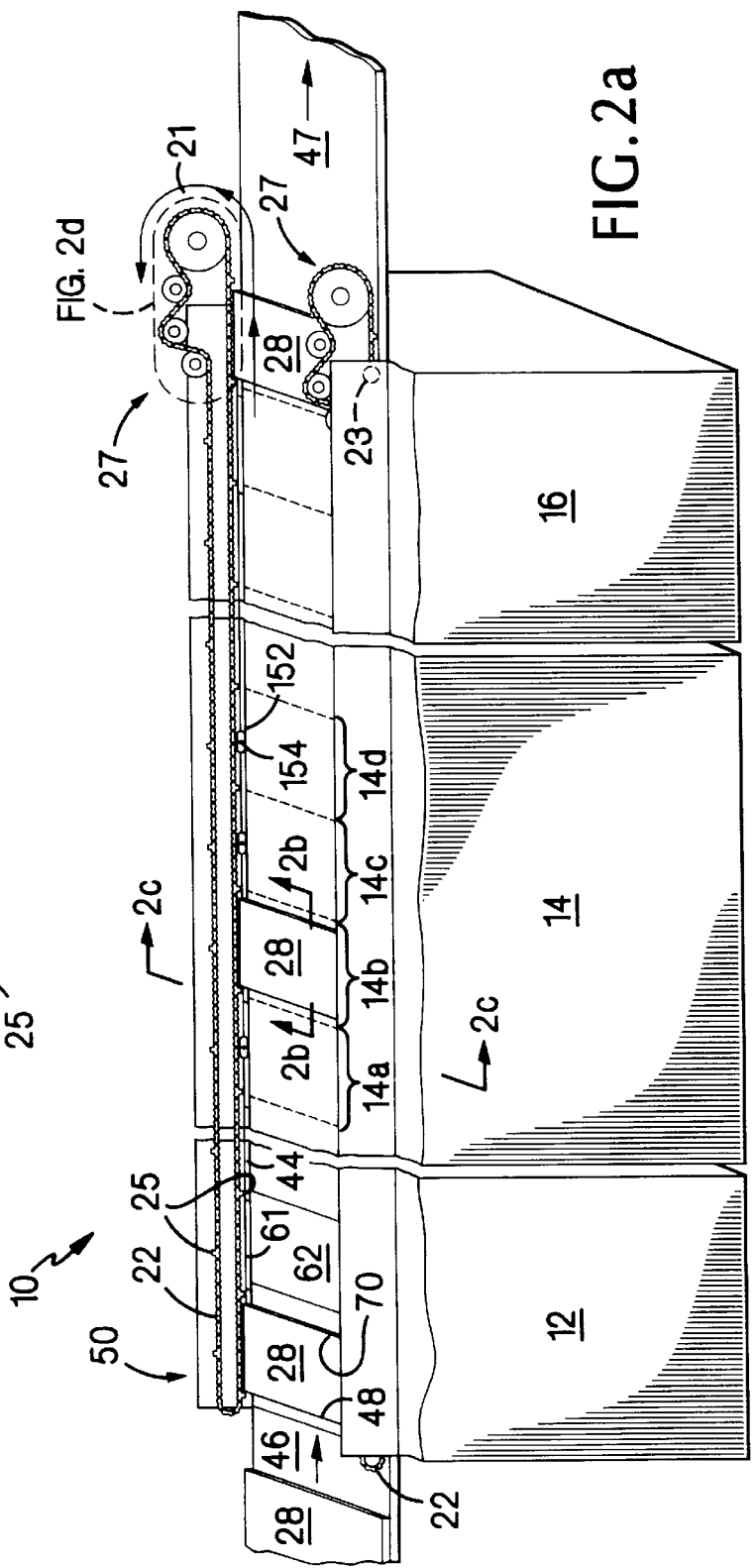

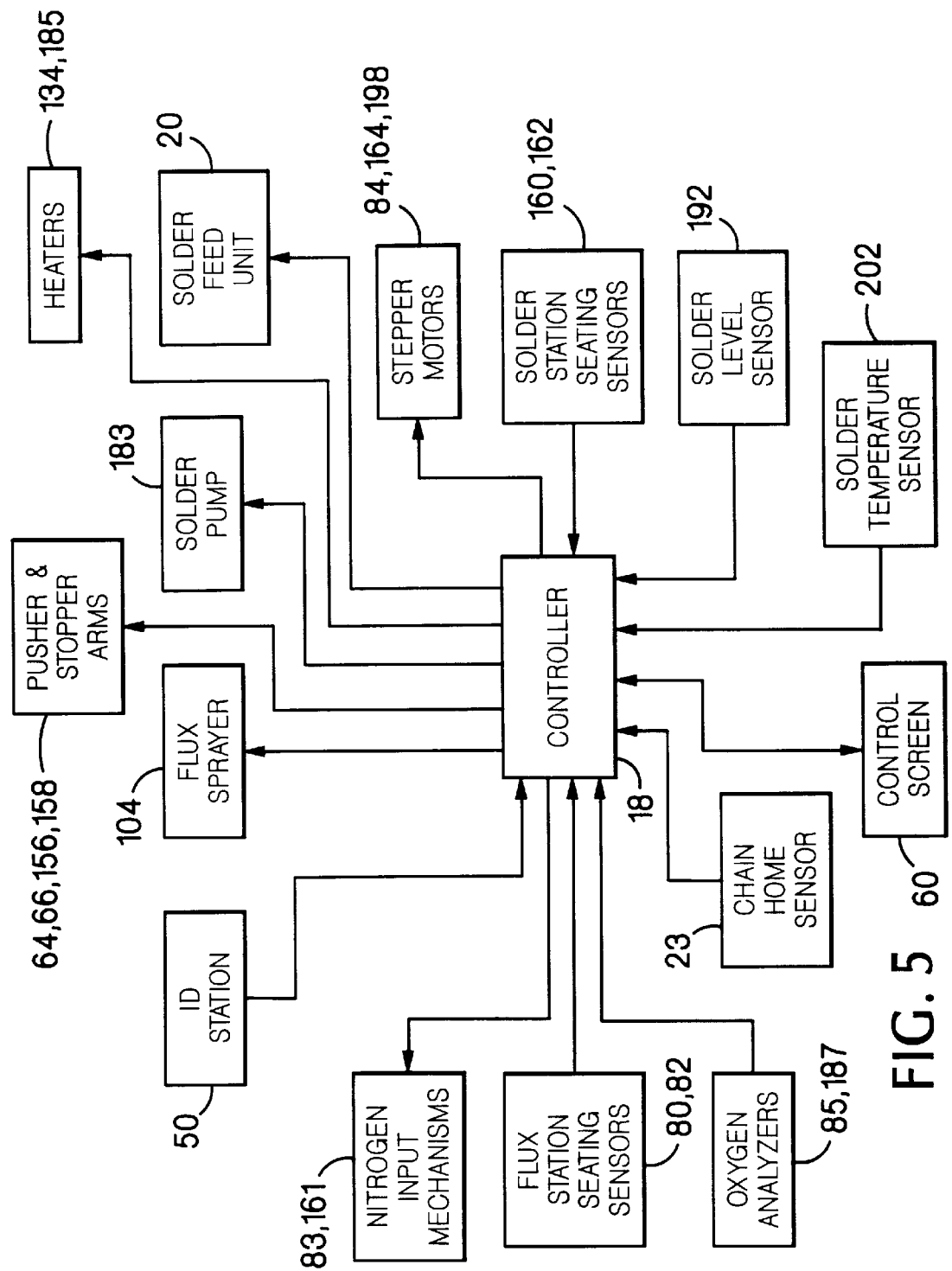

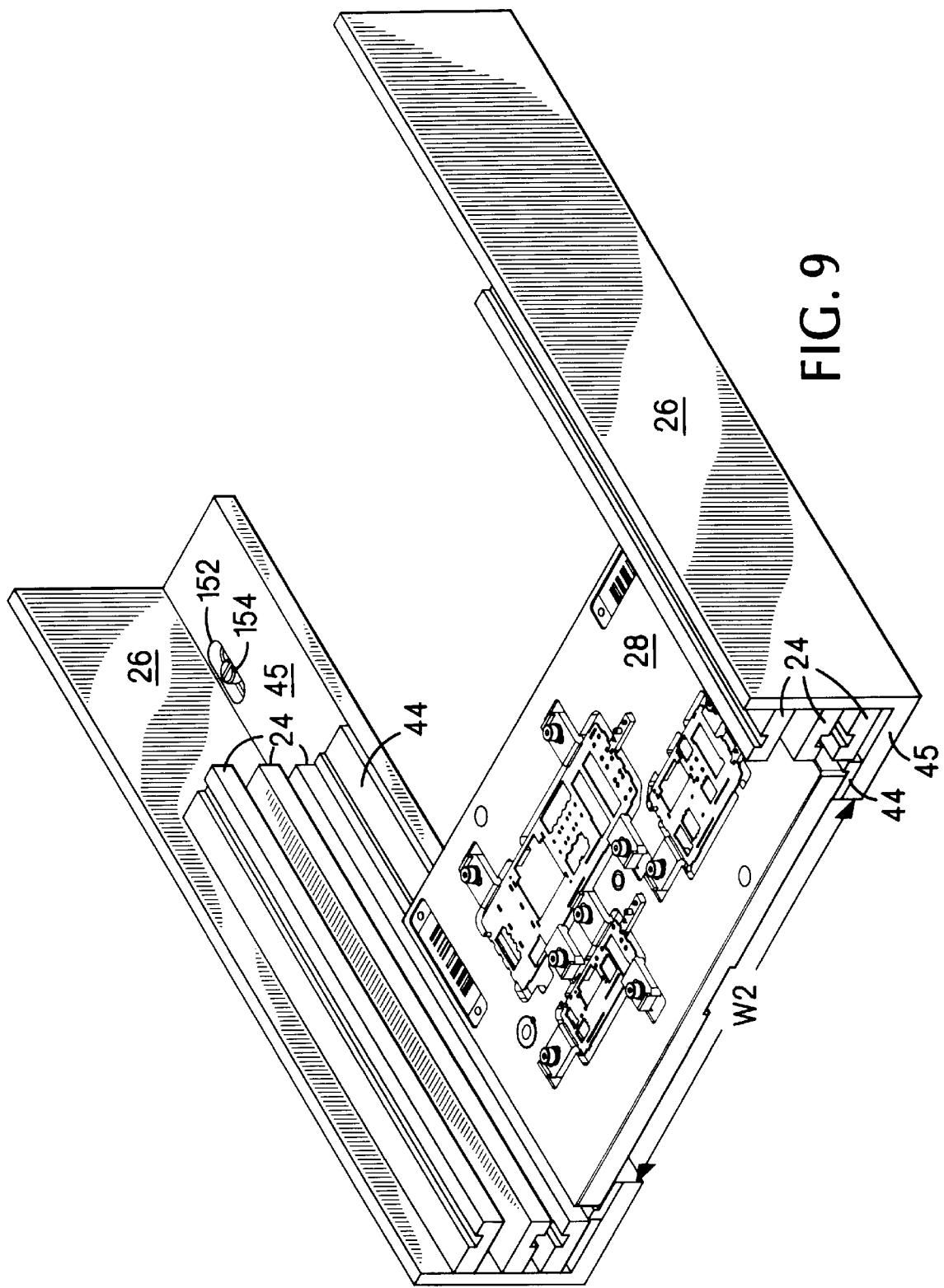

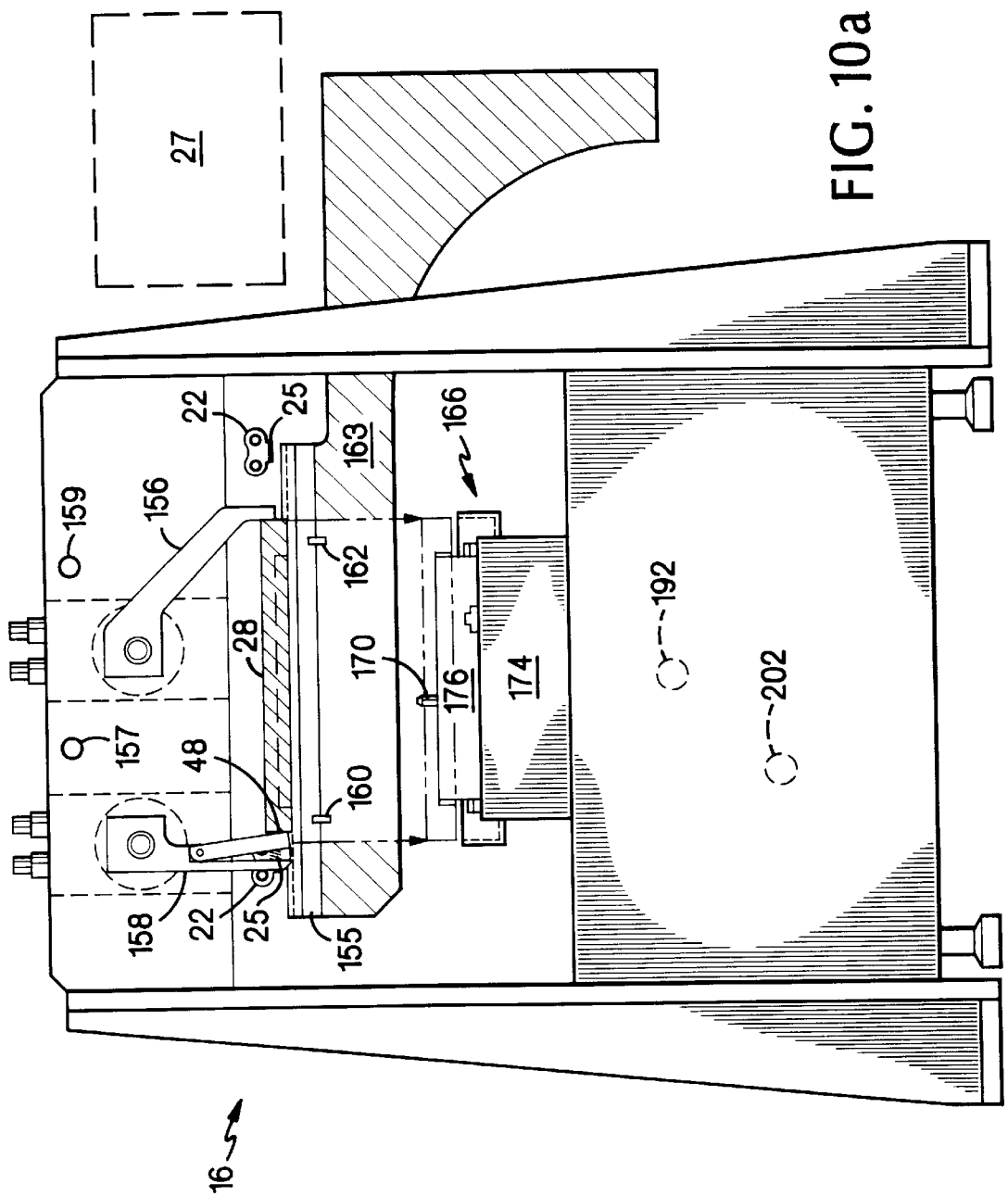

SOLDERING

This is a divisional of application Ser. No. 08/640,018, filed Apr. 30, 1996, now U.S. Pat. No. 5,642,850, which was a divisional of application Ser. No. 08/420,553, filed Apr. 11, 1995, now issued as U.S. Pat. No. 5,560,537 on Oct. 1, 1996.

BACKGROUND

This invention relates to soldering.

In one method of soldering, printed circuit boards (PCBS) which are populated with components pass, one at a time, through a three step process: flux is applied to electrical connection points on both the PCB and the components; the PCB and the components are preheated; and the electrical connection points are brought in contact with molten solder.

SUMMARY

In general, in one aspect, the invention features soldering parts (e.g., printed circuit boards) by indexing the parts sequentially and continuously through a series of processing stations. Each of the series of processing stations includes at least one processing position, and the indexer indexes the parts from processing position to processing position. At different processing stations, the parts indexed into those processing stations are simultaneously processed.

Implementations of the invention may include one or more of the following features. The indexer may have a chain and flights connected to the chain and separated along the chain by an indexing distance. Solder may be applied to the parts at a soldering station. The soldering station may include a solder fountain. The solder fountain may have a solder manifold with a first aperture, a solder well plate with second apertures, where the solder well plate is mounted above the solder manifold with the second apertures above the first aperture, modular solder well plates mounted above the second apertures, and a solder chimney mounted to each of the modular solder well plates. The solder chimneys may provide passageways from the solder manifold to a top of the solder chimneys where the parts are soldered, the parts may be of different part types, and each of the modular solder well plates may correspond to one of the different part types. The solder fountain may also include another solder chimney mounted to each of the modular solder well plates. The soldering station may further include a rough part locator that roughly locates a part indexed into the soldering station and a precise part locator that precisely locates the part. The soldering station may also include a guide rail for supporting the part, and a mechanism for raising and lowering the guide rail. Additionally, flux may be applied to precise areas of the parts at a flux station, and the flux station may include a rough part locator that roughly locates a part indexed into the flux station and a precise part locator that precisely locates the part. The flux station may further include a guide rail for supporting the part and a mechanism for raising and lowering the guide rail. The flux station may include a flux sprayer for applying flux to the part, where the flux sprayer includes an air valve, a flux valve, and a controller coupled to activate and deactivate separately the air valve and the flux valve. The controller may activate the air valve before activating the flux valve and deactivate the flux valve before deactivating the air valve. Furthermore, the parts may be preheated and glue used to mount components to the parts may be cured in an oven. The oven may include sparging tubes for blowing heated gas on the parts as the parts are indexed to an exit end of the oven. The oven may also have a guide rail for supporting the parts as they are indexed through the oven and a support rail for supporting the guide rail, where the support rail includes thermal expansion slots for allowing the support and guide rails to thermally expand longitudinally and where the support rail is held in a fixed position at one end and is free to expand away from the fixed position. Moreover, the processing stations may include an identification station having a sensor for determining a type of a part indexed into the station, and the soldering system may include a controller for controlling subsequent processing stations in response to the sensor. The controller may control the amount of time flux is sprayed at each of the parts according to the identified part type, and the controller may control the pump speed of a solder pump according to the identified part type. The parts may be printed circuit boards, and the parts may include pallets having an aperture for holding one of the printed circuit boards. The pallets may include additional apertures for holding additional printed circuit boards.

In another aspect, the invention features a solder fountain. The solder fountain includes a solder manifold for containing solder, and the solder manifold has a first aperture. The solder fountain also includes a solder well plate having second apertures, where the solder well plate is mounted above the solder manifold with the second apertures above the first aperture. Further, the solder fountain includes modular solder well plates mounted above the second apertures, and a solder chimney mounted to each of the modular solder well plates. The solder chimneys provide passageways from the solder manifold to a top of the solder chimneys where solder is applied to the parts. The parts are of different part types, and each of the modular solder well plates corresponds to one of the different part types.

Implementations of the invention may include one or more of the following features. The chimney passageway may be an unrestricted passageway. The solder fountain may include a rough part locator having a stopper arm with an end that provides a datum point and a pusher arm for pushing the part against the stopper arm and a precise part locator having a datum bushing and a slotted bushing on the part and a datum pin and an expansion pin for respectively engaging the datum bushing and the slotted bushing.

In another aspect, the invention features a flux unit for applying flux to precise areas of printed circuit boards. The flux unit includes a rough part locator that roughly locates a printed circuit board within the flux unit and a precise part locator that precisely locates the printed circuit board.

Implementations of the invention may include one or more of the following features. The rough part locator may include a stopper arm having an end that provides a datum point and a pusher arm for pushing the part against the stopper arm. The precise part locator may include a datum bushing and a slotted bushing on the printed circuit board and a datum pin and an expansion pin for respectively engaging the datum bushing and the slotted bushing.

In another aspect, the invention features a flux unit for applying flux to precise areas of printed circuit boards. The flux unit includes a flux sprayer for applying flux to the printed circuit boards, where the flux sprayer includes an air valve, a flux valve, and a controller coupled to activate and deactivate separately the air valve and the flux valve.

In another aspect, the invention features a convection oven for preheating printed circuit boards. The oven includes multiple sequential indexed positions, a nitrogen input mechanism for providing a nitrogen environment, and a pair of parallel guide rails for supporting the printed circuit boards within the oven. The oven also includes sparging tubes for blowing heated nitrogen on a printed circuit board at an oven exit and a pair of parallel support rails for supporting the pair of guide rails. The support rails include thermal expansion slots for allowing the support and guide rails to thermally expand longitudinally and a fastening mechanism extending through the slots for maintaining a set width between the guide rails.

In another aspect, the invention features a method for use in connection with soldering printed circuit boards of different types moving along an automated production line. The method includes identifying a type of each of the printed circuit boards that approaches a flux station on the production line and applying flux to a specific area of the printed circuit board for an amount of time corresponding to the type of the board.

In another aspect, the invention features a method for use in connection with soldering printed circuit boards of different types moving along an automated production line. The method includes identifying a type of each of the printed circuit boards that approaches a solder station on the production line and setting a solder pump speed appropriate to providing a stable top surface of a column of solder of a predetermined height in a solder fountain used to apply solder to a specific area of the printed circuit board.

Advantages of the invention may include one or more of the following. The amount of handling required to solder components to printed circuit boards (PCBs) is reduced and the number of PCBs soldered in a given period of time is increased. The PCBs are uniformly heated and not subject to damaging temperatures. The top surface of solder columns are stable which permits precise soldering of multiple PCB areas while preventing solder from spreading to other closely spaced PCB areas.

Other advantages and features will become apparent from the following description and from the claims.

DESCRIPTION

FIG. 2a is a cut-away view at 2a—2a in FIG. 1a.

FIGS. 2b and 2c are cross-sectional views at 2b—2b and 2c—2c, respectively, in FIG. 2a.

FIG. 2d is an enlarged view of a chain tensioner in FIG. 2a.

FIGS. 4a and 4b are cross-sectional views of an identification station at 4a—4a and 4b—4b, respectively, in FIG. 1a.

FIG. 5 is a block diagram of a control system for a continuous soldering system.

FIGS. 6a and 6b are cross-sectional views of a flux unit at 6a—6a in FIG. 1b and 6b—6b in FIG. 1a.

FIG. 8a is a cross-sectional view of an oven at 8a—8a in FIG. 1a.

FIGS. 8b and 8d are cross-sectional views at 8b—8b and 8d—8d, respectively, in FIG. 8a.

FIG. 8c is a perspective view at 8c—8c in FIG. 8a.

FIG. 9 is a perspective view of a pallet and a slot and a shoulder screw in a support rail.

FIGS. 10a and 10b are cross-sectional views of a solder station at 10a—10a in FIG. 1a and 10b—10b in FIG. 1b, respectively.

FIG. 11b is a perspective view of a pallet loaded with PCBs over the solder fountain of FIG. 11a.

Figure 1A:
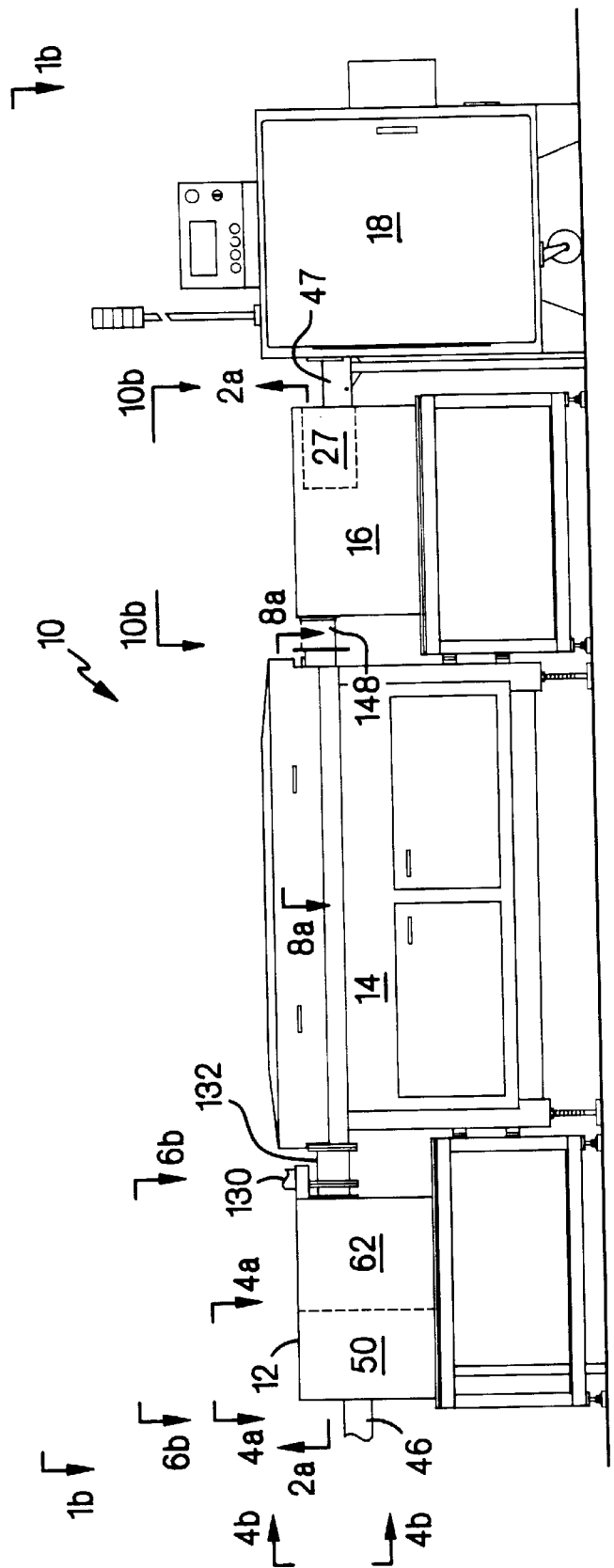
FIGS. 1a and 1b are side and top views, respectively, of a continuous soldering system.
Figure 1B:
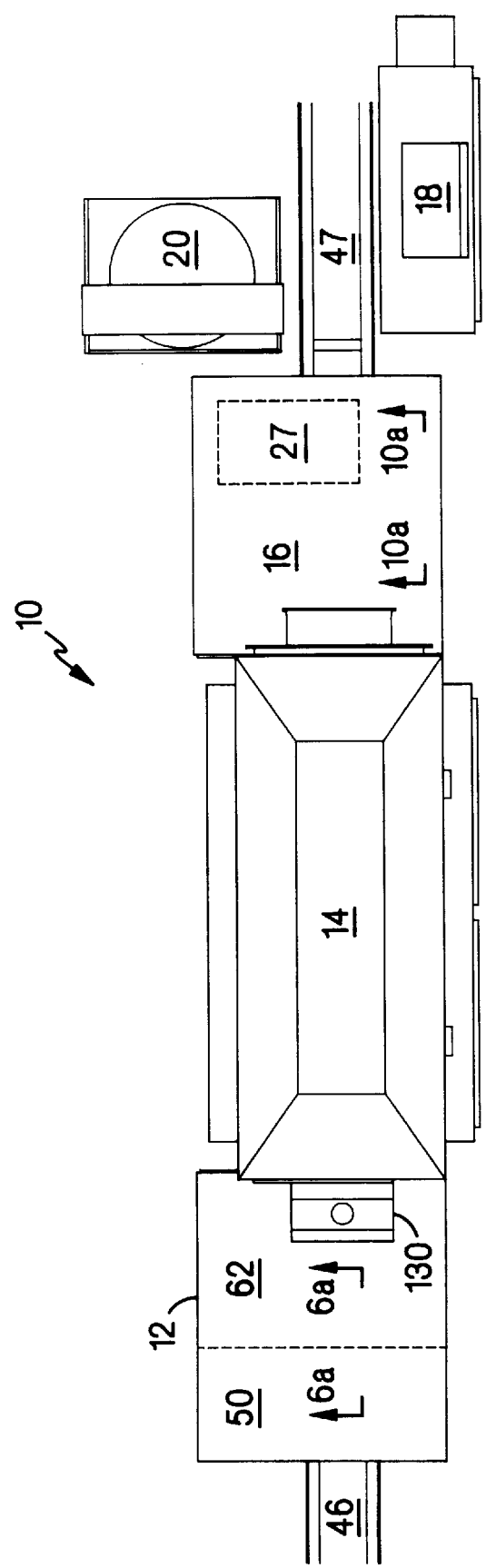

Referring to FIGS. 1a and 1b, a system 10 for continuously soldering printed circuit boards (PCBs) includes a flux station 12, an oven 14, and a solder station 16. System 10 also includes a controller 18, for example, a programmable logic controller, of the type manufactured by Allen-Bradley Corp., Highland Heights, Ohio, USA, that monitors and controls the operation of system 10 and a solder feed unit 20 coupled to solder station 16 which, under control of controller 18, feeds solder to solder station 16.

Figure 2C:
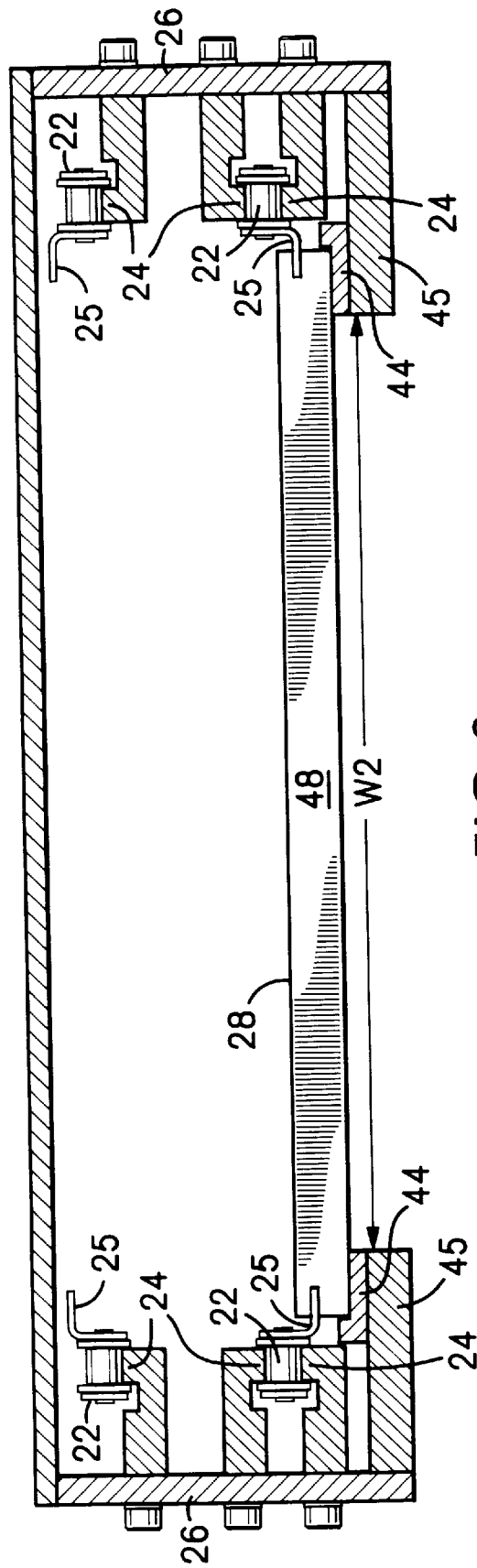

Referring to FIGS. 2a—2c, flux station 12, oven 14, and solder station 16 are interconnected by two parallel chains 22. Chains 22 are supported on chain guides 24 which are connected to mounting rails 26, and at predetermined distances, e.g., 8 inches, along each chain, a flight 25 is mechanically connected to the chain. The chains 22 are indexed forward (arrow 21) periodically, e.g., every 10 seconds, by the predetermined distance, e.g., 8 inches, between the chain flights to locate each flight and its neighbor on either end of an indexed chain position, e.g., 14a, within system 10. When system 10 is powered up, controller 18 advances chains 22 until home sensor 23 (e.g., a proximity sensor of the kind manufactured by Turck, Inc.) detects a leading edge of a flight. Chains 22, chain guides 24, mounting rails 26, and flights 25 are stainless steel.

Figure 2D:
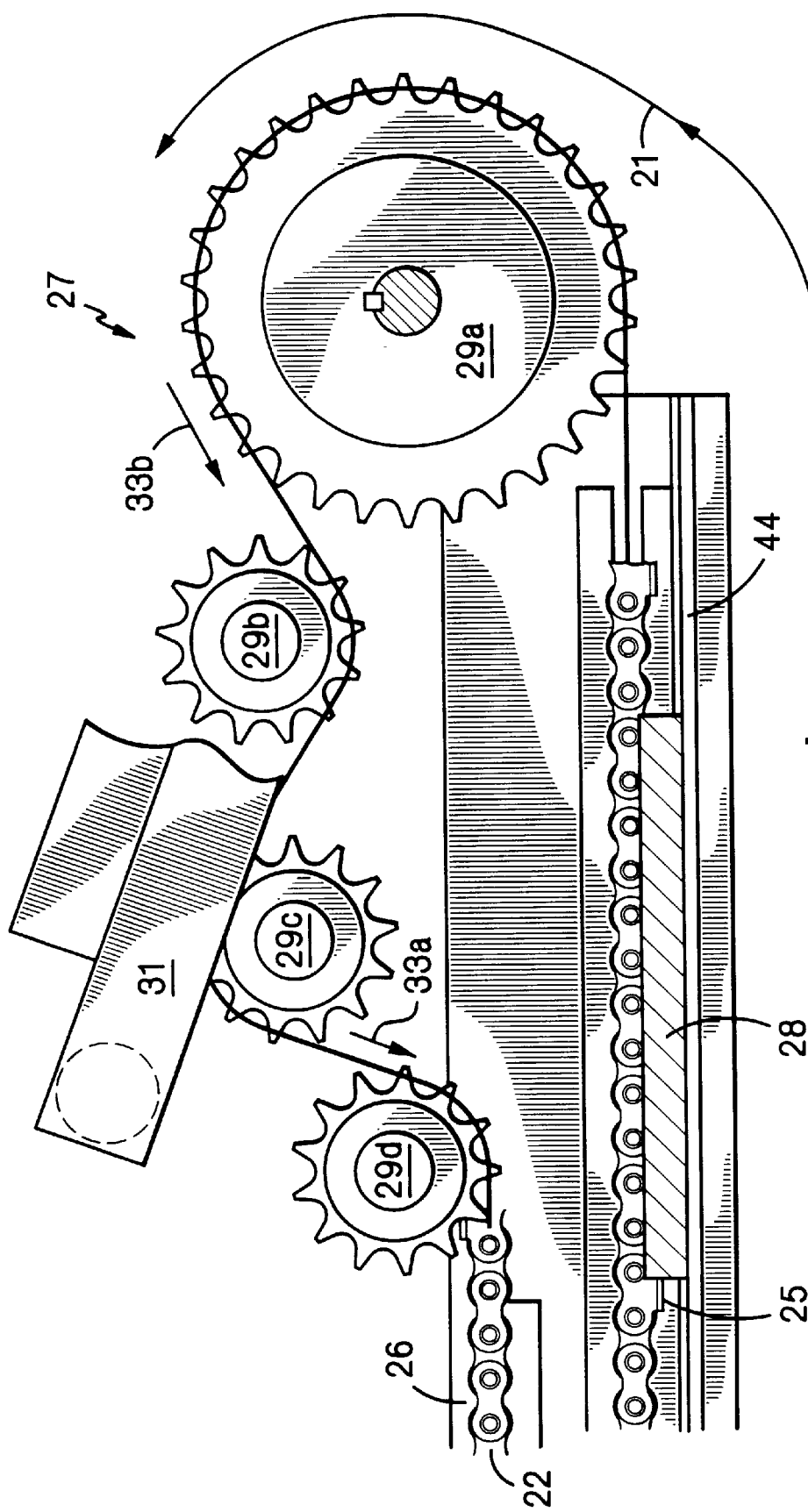

As chains 22 pass through oven 14 they are heated and, although they are stainless steel, which has a low thermal expansion coefficient, they expand with the heat. Chains 22 also stretch with age. A weighted chain tensioner 27 (FIGS. 2a and 2d) is mechanically coupled to chains 22, through sprockets 29a, 29b, 29c, and 29d, and together with a weight 31, the chain tensioner pushes down on the chains to maintain a constant chain tension (arrows 33a and 33b) regardless of temperature or age.

Figure 3:
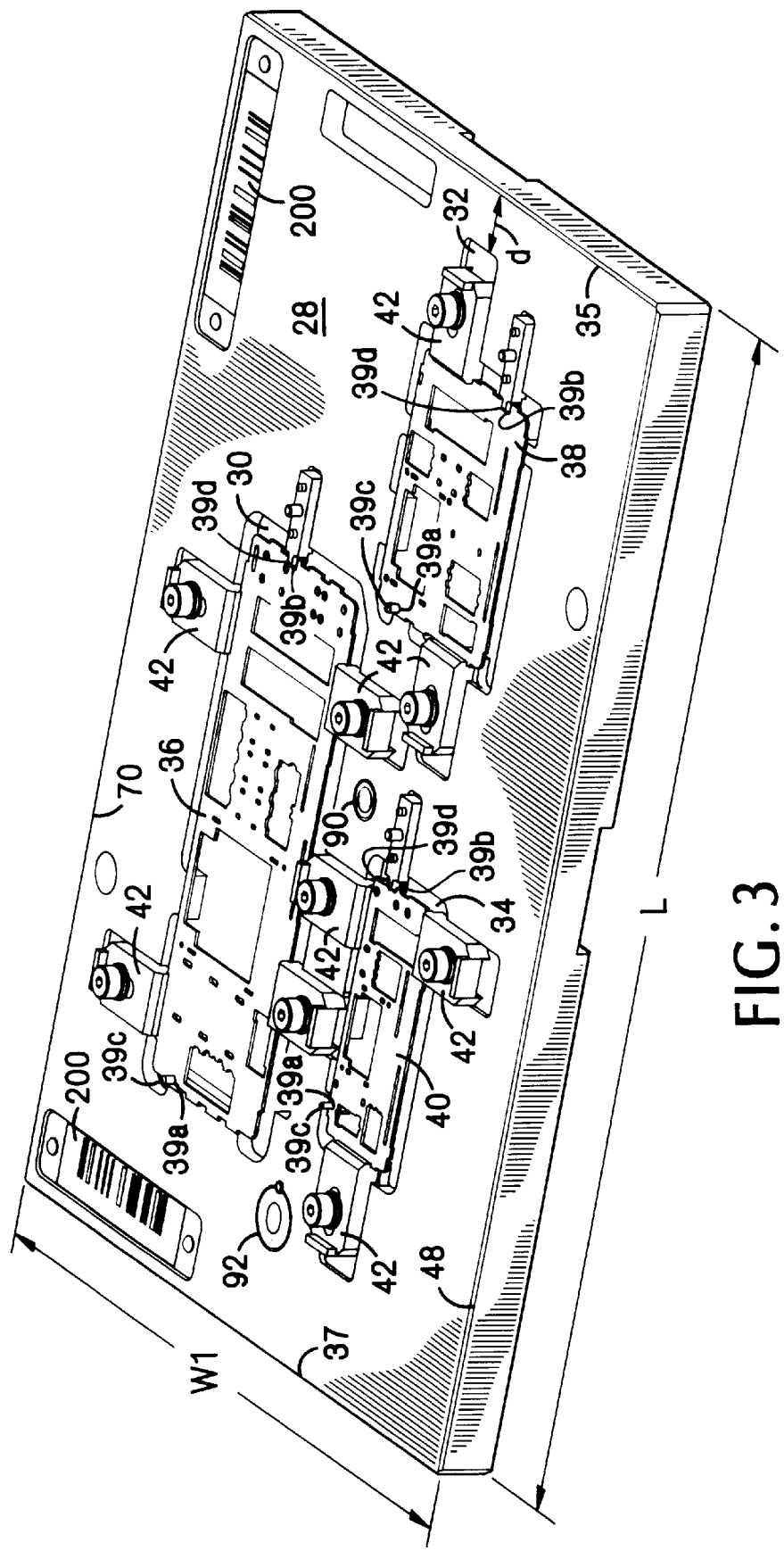
FIG. 3 is a perspective view of a pallet loaded with printed circuit boards (PCBs).

Referring to FIG. 3, PCBs are carried through the system on pallets. A pallet 28 includes three apertures 30, 32, and 34. Each PCB 36, 38, and 40 (shown unpopulated, i.e., without mounted components, for clarity, but which normally have mounted components) has a locating pin hole 39a and a locating slot 39b, and for each aperture 30, 32, and 34, pallet 28 includes a tooling pin 39c and an extension pin 39d. Each PCB 36, 38, and 40 is precisely located within apertures 30, 32, and 34, respectively, when tooling pin 39c engages locating pin hole 39a and extension pin 39d engages locating slot 39b. Further, each PCB 36, 38, and 40 is supported within apertures 30, 32, and 34, respectively, by locating clips 42. Each clip applies force to a side of a PCB in a direction from that side of the aperture toward an opposite side of the aperture.

The PCBs may be of a single type or, as shown, may be of three different types with each aperture 30, 32, 34 corresponding to a particular type of PCB. When the PCBs are three different types, each pallet 28 is generally loaded with only one of the three types, which allows the system to be configured to tailor PCB processing in accordance with the type of PCB loaded in each pallet.

Pallets 28 are loaded onto stainless steel guide rails 44 (FIGS. 2a, 2c) within system 10 either manually or automatically, e.g., by a Bosch conveyor belt 46 which is indexed synchronously with chains 22. Pallets 28 are centered on conveyor belt 46. Apertures 30, 32, and 34 (FIG. 3) are at least a distance, d, e.g., about 0.70 inches, from edges 35 and 37 of pallets 28 to allow edges 35 and 37 to rest on guide rails 44. To allow the pallets to smoothly pass from conveyor belt 46 to guide rails 44, the top surface of conveyor belt 46 is approximately 0.005–0.010 inches above the top surface of guide rails 44 and guide rails 44 have a lead-in chamfer,-e.g., of about 0.030 inches. Flights 25 engage a back edge 48 of each pallet 28 and push the pallet through system 10 as chains 22 are indexed. System 10 includes a sequence of processing stations and, at each indexed chain position, each processing station may execute a certain procedure, such as applying flux, solder, or heat to PCBs loaded in pallets. The index period is limited, therefore, by the slowest procedures, for example, by the application of solder at solder station 16, and by the time required to index chain 22, for example, 1.5 seconds. As an example, where the distance between the flights is about 8 inches, the width W1 of the pallets 28 is about 6.30 inches which provides a clearance of about 1.70 inches between pallets 28. After being indexed through solder station 16, pallets 28 are pushed by flights 25 from guide rails 44 to a second indexed conveyor belt 47. The top surface of conveyor belt 47 is approximately 0.005–0.010 inches below the top surface of guide rails 44 to allow the pallets to smoothly pass from guide rails 44 to belt 47.

Figure 4A:
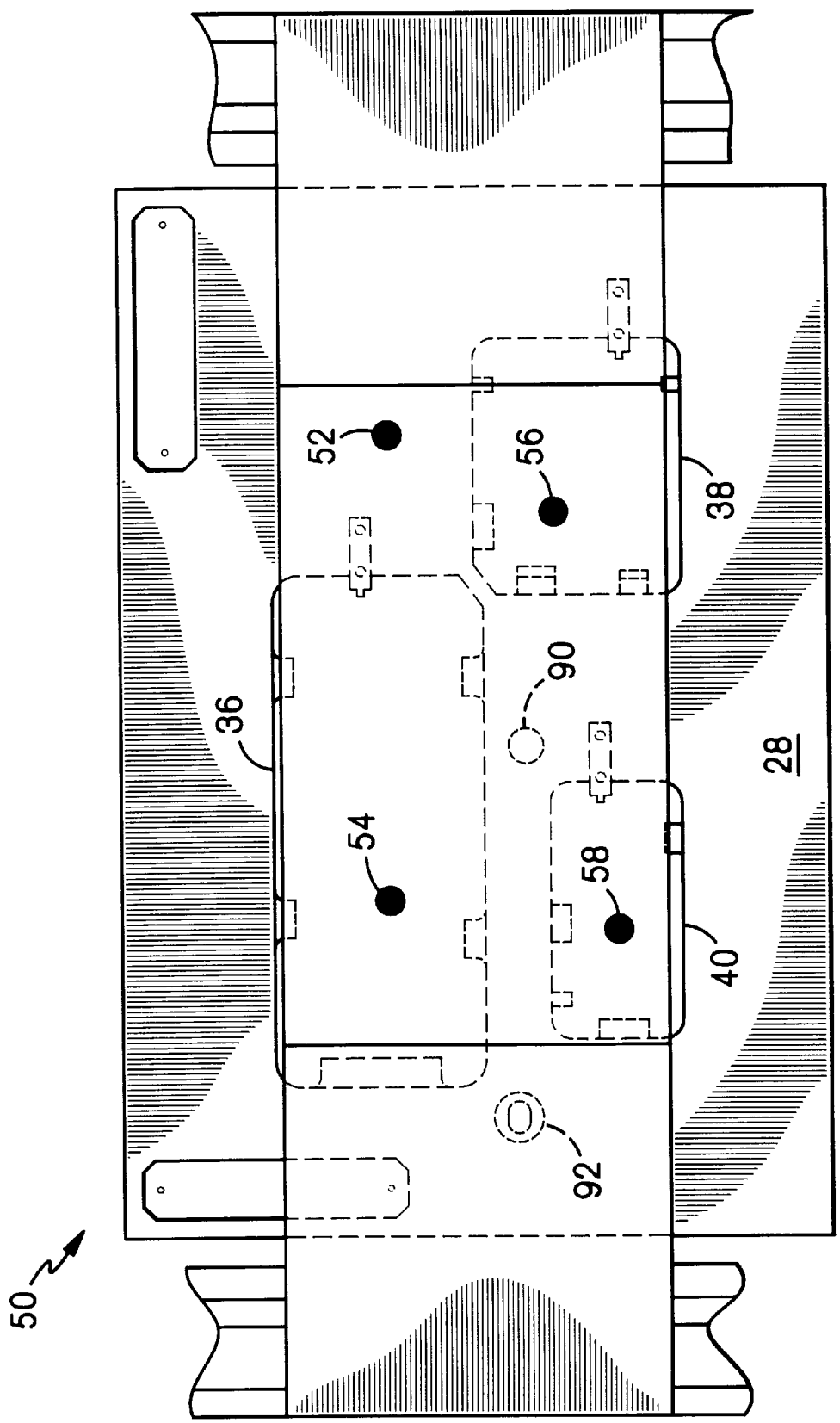
Figure 4B:
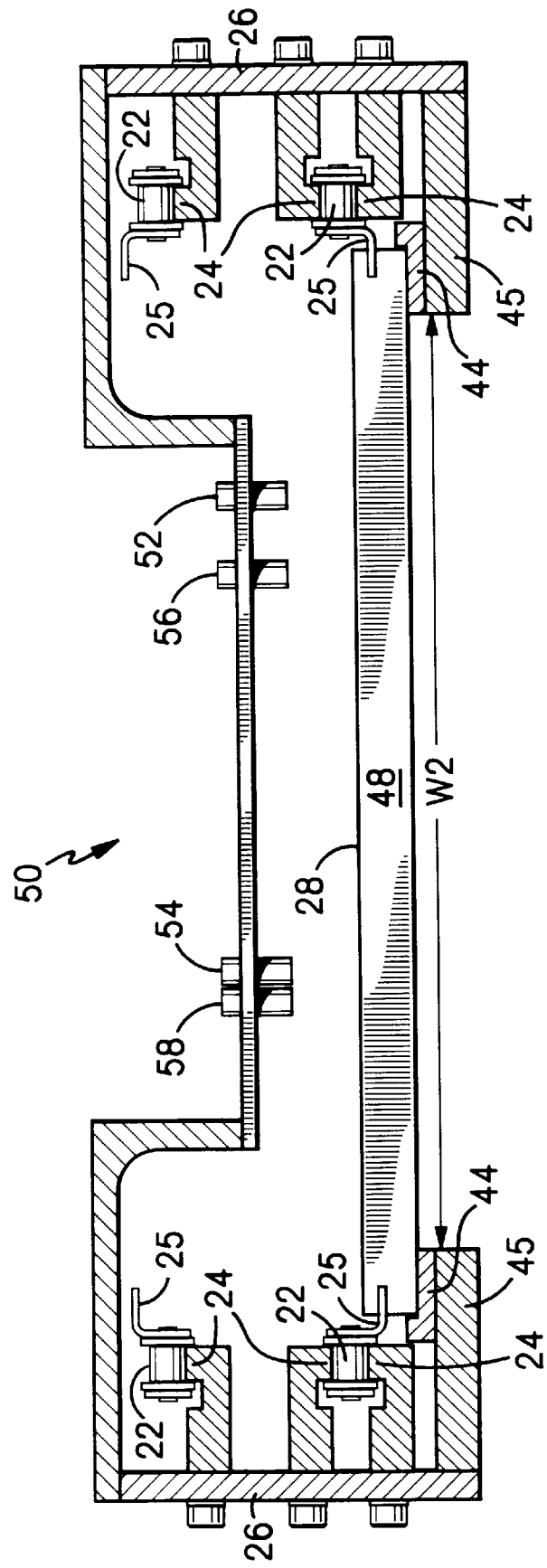

Referring to FIGS. 4a and 4b, within flux station 12, a first indexed chain position locates a pallet 28 at an identification (ID) station 50. ID station 50 includes four retroreflective sensors 52, 54, 56, and 58 (e.g., a fiber photoelectric sensor having a transmitter, for example, a light emitting diode (LED), and a receiver). Sensor 52 detects the presence of the pallet by receiving light reflected from the pallet. Sensors 54, 56, and 58 detect the presence of the particular PCBs 36, 38, and 40, respectively, by receiving light reflected from those PCBS.

Referring to FIG. 5, the sensors within ID station 50 send electrical signals to controller 18 to notify controller 18 that a pallet 28 is present and to notify controller 18 which pallet aperture(s) 30, 32, or 40 contains a PCB (i.e., which PCB type(s) is present within that pallet). If sensor 52 detects a pallet, but none of the sensors 54, 56, and 58 detect a PCB, then controller 18 indicates an error condition on control screen 60 to notify an operator. The controller may automatically prevent chain 22 from indexing until the pallet is removed or the operator, using control screen 60 and controller 18, may manually prevent chain 22 from indexing until the pallet is removed. Alternatively, the controller can automatically or the operator can manually allow the pallet to proceed through system 10 and prevent the flux unit 62 (FIG. 6a) and solder station 16 from operating when that pallet is indexed into those stations.

Figure 6A:
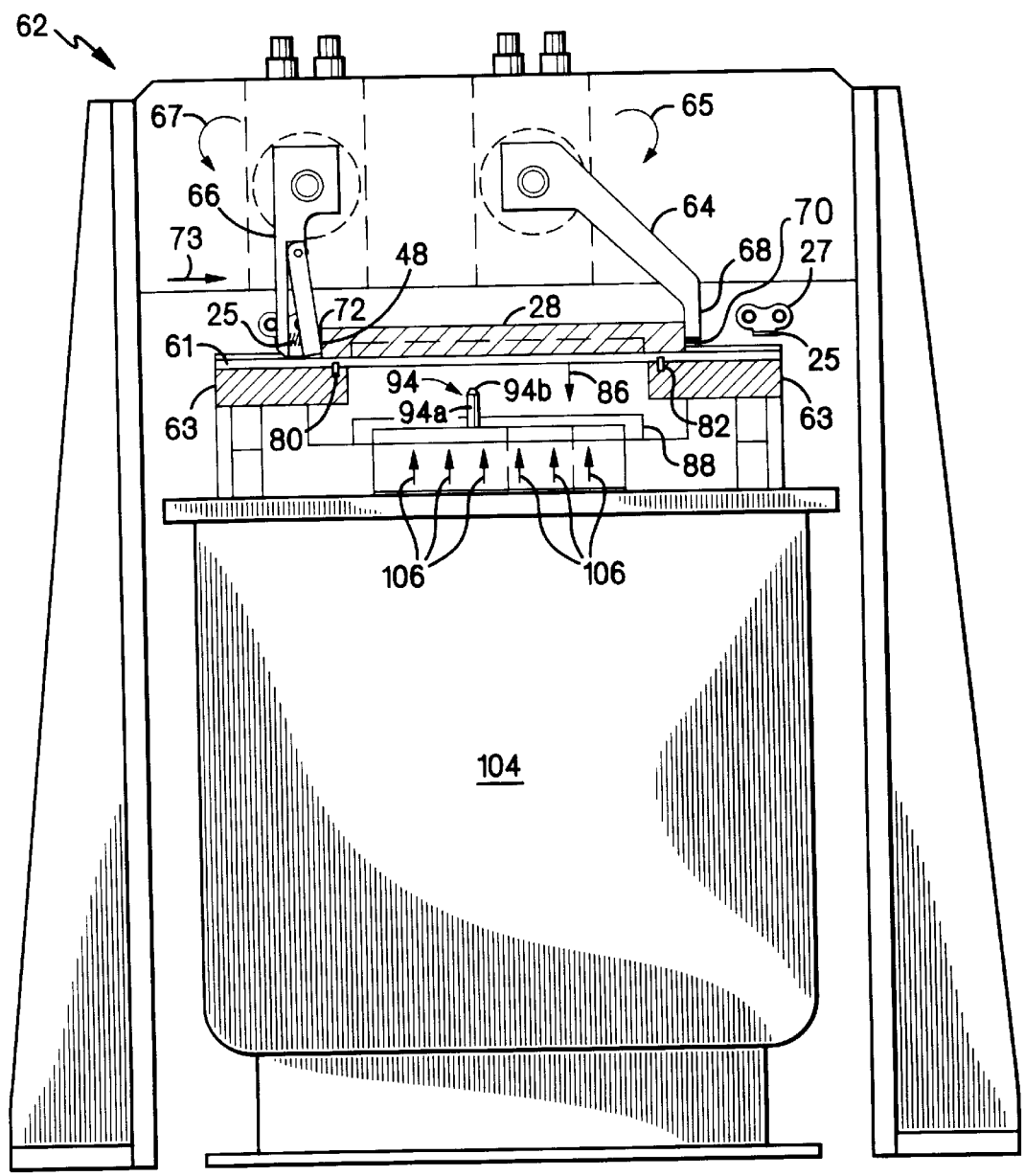
Figure 6B:
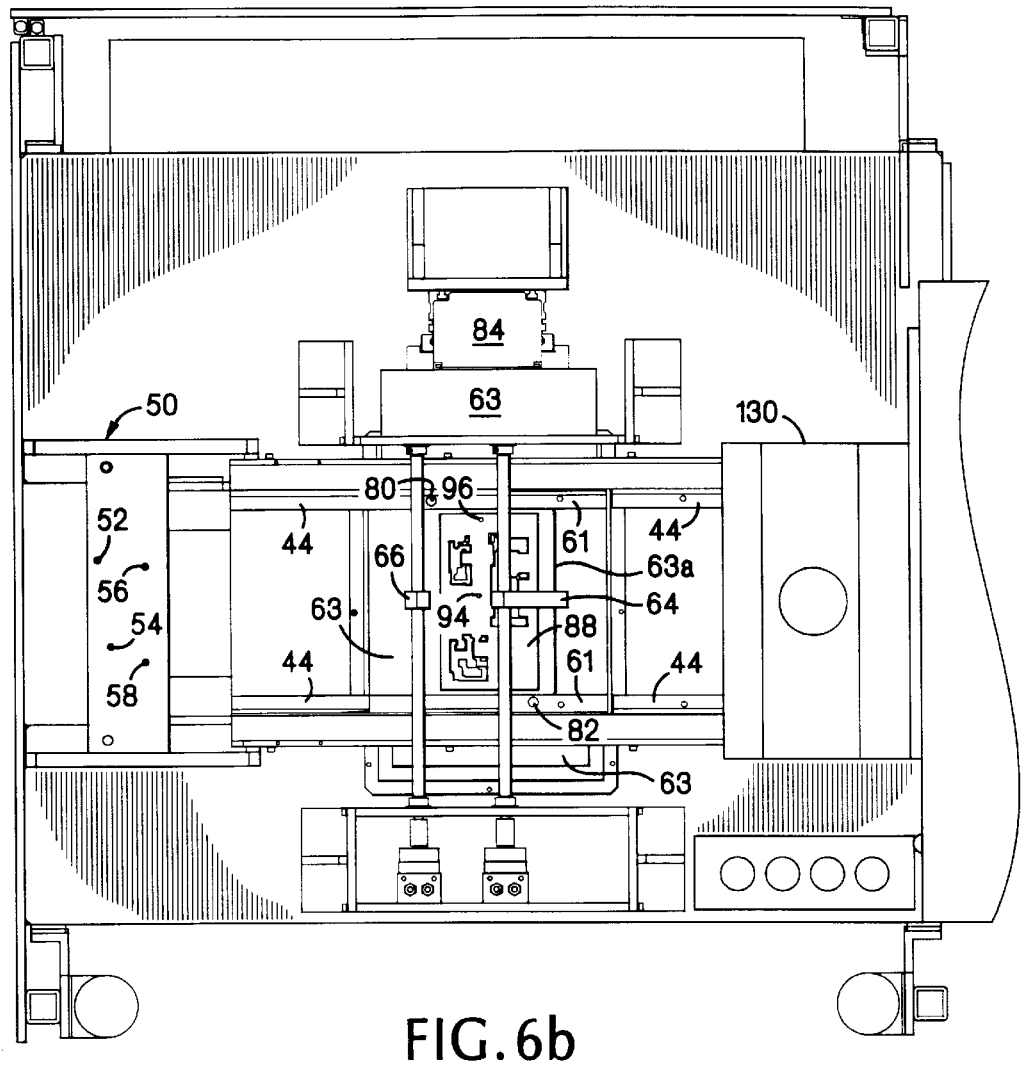

Referring to FIGS. 6a and 6b, a second indexed chain position locates the pallet 28 on flux rails 61 of a flux unit 62 within flux station 12. Because chains 22 can stretch as they age and as they are heated, two pneumatic actuator arms, a stopper arm 64 and a pusher arm 66, are used to roughly locate the pallet. When the pallet is indexed onto flux rails 61, stopper arm 64 is activated and rotates (arrow 65) a predetermined amount to position an end 68 at a datum point beyond a front edge 70 of the pallet, and when activated, pusher arm 66 also rotates (arrow 67) a predetermined amount to position an end 72 against and push (arrow 73) back edge 48 of the pallet such that front edge 70 contacts stopper arm 64. This action positions the front edge 70 of the pallet at the datum point (i.e., against end 68 of stopper arm 64). Pusher arm 66 includes a spring loaded lever 74 that compresses (arrow 75) slightly when front edge 70 of the pallet contacts stopper arm 64. Spring loaded lever 74 compensates for the pallet width tolerance and the rotation tolerances of stopper arm 64 and pusher arm 66 and prevents the arms from applying significant pressure to the front and back edges of the pallet.

Once the pallet is roughly located, controller 18 determines whether the pallet is properly seated on rails 61 with seating sensors 80 and 82, e.g., retroreflective sensors, located at two diagonal corners of the pallet. The amount of reflected light which should be received by sensors 80, 82 when the pallet is properly seated on rails 61 is predetermined during a set up procedure, and if the amount of reflection indicates, for example, that one or both corners f the pallet are a predetermined distance, e.g., 0.015 inches, or more above or below rails 61, then controller 18 indicates an error on control screen 60 (FIG. 5) to notify the operator of the error. Controller 18 may then automatically prevent chains 22 from indexing until the sensors indicate that the error has been fixed or the operator, through control screen 60 and controller 18, may manually prevent the chain from indexing until he or she fixes the error.

Rails 61 are mechanically coupled to an axis or a rail table 63 having a central aperture 63a. Rail table 63 is mechanically coupled to a lead screw (not shown) which is driven by a stepper motor 84. If the pallet is properly seated on rails 61, controller 18 sends electrical signals to stepper motor 84 to cause stepper motor 84 to turn the lead screw to lower (arrow 86) rail table 63 and rails 61 to a predetermined position above, approximately 1.0–1.5 inches, flux mask 88. With a lead screw having a repeatability of about ±0.00039 inches and a position accuracy of about ±0.0003 inches and a motor 84 such as an SX57-102 motor manufactured by Compumotor, Inc. a rail height position accuracy of about ±0.001 inches is possible.

The pallet includes a datum bushing 90 and a slotted bushing 92 (FIGS. 3, 6c) both having radiused lead-in edges. As the pallet is lowered, a datum pin 94 and an expansion pin 96, which are press fitted to flux mask 88 and extend above flux mask 88, are inserted within datum bushing 90 and slotted bushing 92, respectively. The shanks (shank 94a of datum pin 94 is shown in FIG. 6a) are straight and round and have a tapered top (94b). The tapered shanks engage the radiused bushings to precisely align the pallet. As an example, the shank diameter of both pins 94, 96 is approximately 0.187 inches and the diameter of the top of both pins is about 0.157 inches. The datum bushing has a diameter of about 0.191 inches with a 1/32 inch radiused lead-in, while the slotted bushing has a length of about 0.234 inches, a width of about 0.191 inches, and a 1/64 inch radiused lead-in.

The combination of the datum bushing 90 and slotted bushing 92 ensures that the pins 94, 96 will properly mate with the bushings despite thermal expansion or contraction of the pallet. As the pallet passes through system 10, temperature variations may cause the pallet to expand and contract. Thermal expansion is greatest toward the areas of least resistance, typically, edges 35, 37, 48, and 70. Because datum bushing 90 is substantially centered with respect to the length L and width W1 of the pallet, the potential thermal expansion of the pallet from the datum bushing toward back edge 48 and front edge 70 of the pallet is substantially equal and the potential thermal expansion of the pallet from the datum bushing toward edges 35 and 37 is substantially equal. As a result, the position of datum bushing 90 remains substantially centered with respect to the edges of the pallet as the pallet thermally expands and contracts and, therefore, very little clearance, approximately 0.004 inches, between datum pin shank 94 and datum bushing 90 is required. Similarly, because slotted bushing 92 is substantially centered with respect to the width W1 of the pallet, the potential thermal expansion of the pallet from the slotted bushing toward back edge 48 and front edge 70 is substantially equal and very little clearance, approximately 0.004 inches, is required between the sides 92a, 92b of slotted bushing 92 and the shank of expansion pin 96. On the other hand, slotted bushing 92 is not centered with respect to the length L of the pallet and the potential for thermal expansion of the pallet from the slotted bushing toward edge 35 is far greater than the thermal expansion of the pallet from the slotted bushing toward edge 37. As a result, the length of slotted bushing 92 provides a large length-wise clearance, approximately 0.047 inches, between expansion pin 96 and the sides 92c, 92d of slotted bushing 92 to compensate for unequal potential thermal expansion and contraction of the pallet between slotted bushing 92 and edges 35 and 37.

Similarly, the combination of locating pin hole 39a (FIG. 3) and locating slot 39b is used to compensate for potentially unequal thermal expansion and contraction of the pallet and a PCB located within an aperture of the pallet by tooling pin 39c and extension pin 39d.

Once the pallet is lowered to the predetermined distance above flux mask 88 and the pallet is precisely located by pins 94, 96, controller 18 checks, using seating sensors 80, 82, whether the pallet is properly seated on rails 61. If the pallet is not properly seated, controller 18 notifies the operator of the error through control screen 50 (FIG. 5) and either controller 18 automatically prevents chains 22 from indexing until the sensors indicate the pallet is properly seated, or the-operator, through control screen 60 and controller 18, prevents the chains from indexing until the pallet is properly seated, or the process is continued and the PCB(s) in that particular pallet is considered a reject. The controller may automatically or the operator, through control screen 60 and controller 18, may manually raise and lower rails 61 again to try to properly seat the pallet.

Once the pallet is properly seated, controller 18 sends electrical signals to a flux sprayer 104 to cause flux to be sprayed upward (arrows 106, FIG. 6a) toward flux mask 88 but only in the area(s) of a loaded PCB(s). Flux mask 88 can be machined from many materials, including plastic or plated steel.

Figure 6C:
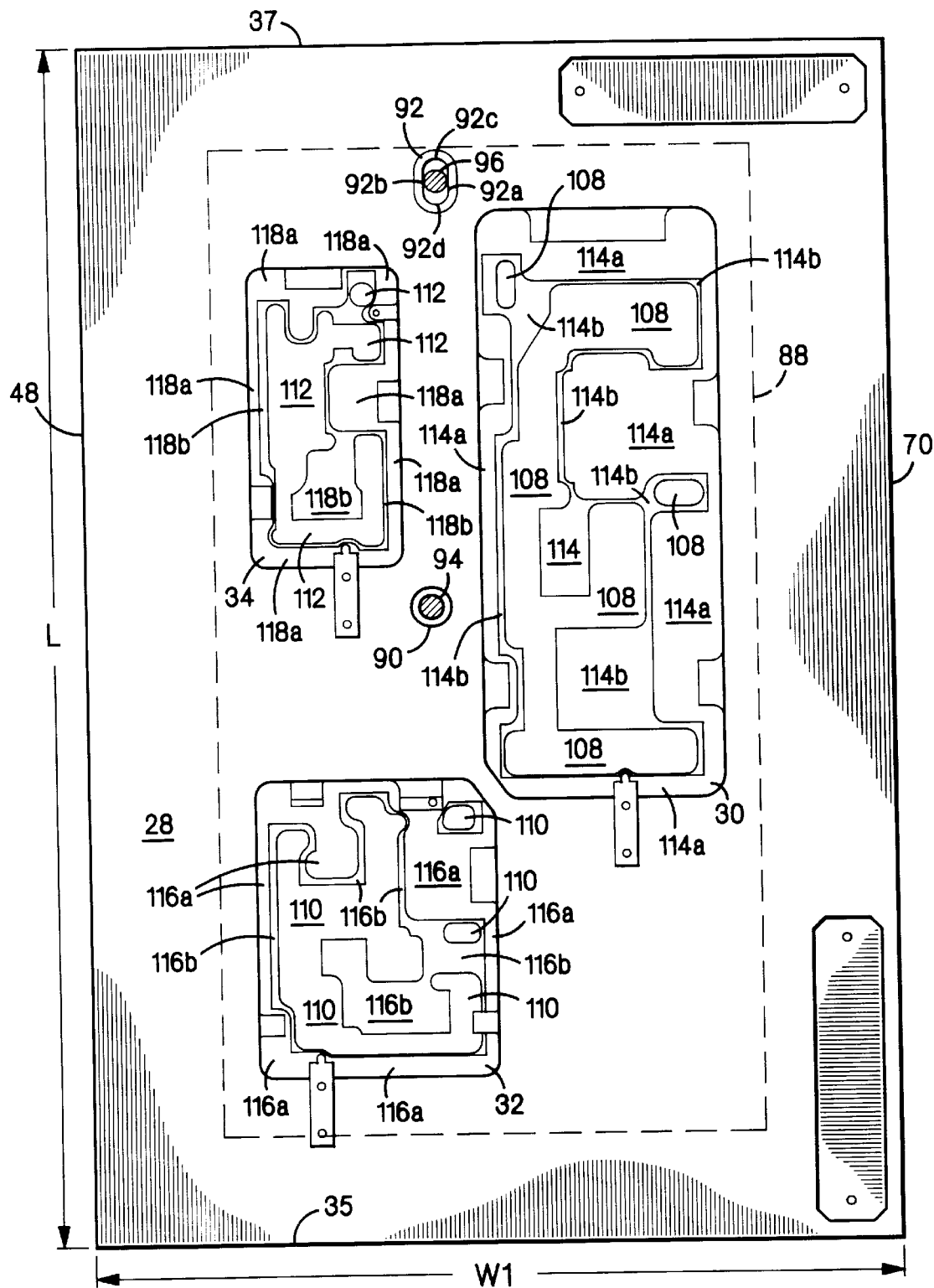
FIG. 6c is a top view of a pallet not loaded with PCBs over a flux mask.

Referring to FIG. 6c, flux mask 88 includes apertures 108, 110, 112 which correspond to particular areas of PCBs 36, 38, 40, respectively (not shown, for clarity) where electrical connection points between components mounted on the PCBs and the PCBs are to be soldered in solder station 16 (FIG. 1a). When flux sprayer 104 sprays flux, the flux passes through apertures 108, 110, and 112 and provides a thin coat on the particular PCB areas. Portions 114, 116, 118 of the flux mask prevent flux from being applied to other areas of the PCBs.

Flux mask portions 114, 116, 118 can be divided into two or more sections of differing heights. For example, flux mask portions 114a, 116a, and 118a are lower (i.e., closer to flux sprayer 104) than flux mask portions 114b, 116b, and 118b.

Lower flux mask portions 114a, 116a, and 118a can accommodate components (e.g., single turn transformer windings, not shown) that extend from a bottom surface of the PCBs and allow connection points located on the PCBs next to the upper flux mask portions 114b, 116b, and 118b to be brought as close as possible to flux sprayer 104.

Figure 7B:
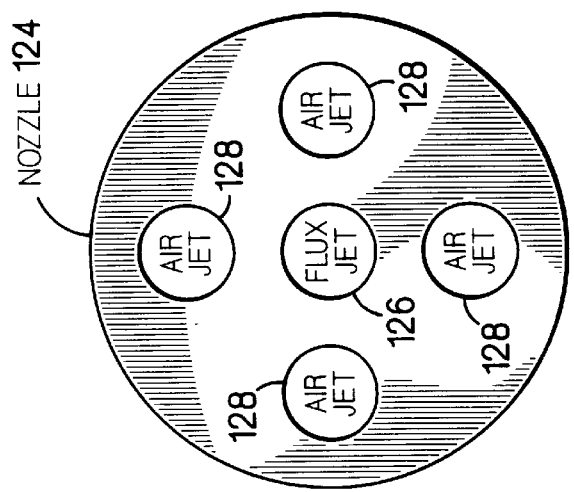
FIG. 7b is a block diagram of a nozzle.
Figure 7A:
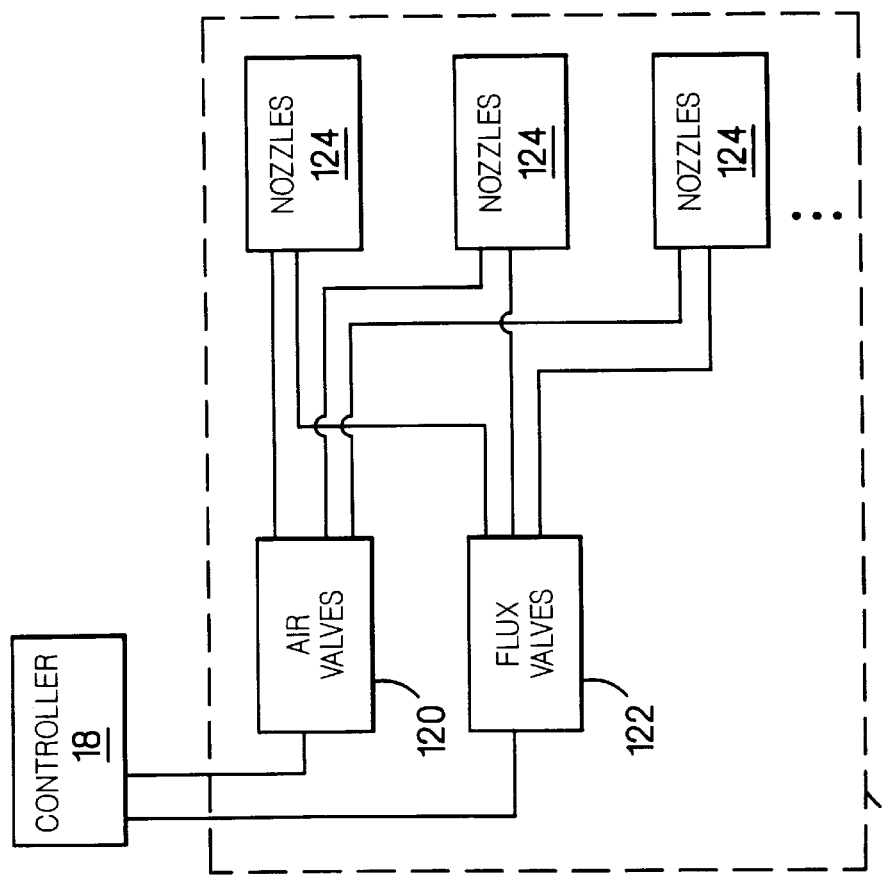
FIG. 7a is a block diagram of a flux sprayer.

Referring to FIG. 7a, flux sprayer 104 includes a set of two valves, a pneumatic air valve 120 and a flux valve 122, for each aperture 30, 32, and 34 (FIG. 3) of pallet 28. Both valves are controlled by controller 18. Flux sprayer 104 also includes a set of one or more nozzles 124 directed at each aperture 30, 32, and 34 to provide an even application of flux to PCBs loaded with the apertures. For example, three nozzles are directed at large PCB 36, two nozzles are directed at medium PCB 38, and one nozzle is directed at small PCB 40. Referring to FIG. 7b, each nozzle 124 includes one flux jet 126 and multiple (four are shown, but there may be more) air jets 128 directed at flux mask 88. Air expelled by the air jets atomizes flux expelled by the flux jet. The controller selectively activates only those sets of air and flux valves associated with apertures within which-PCBs are loaded.

In typical flux stations, the air valve may be used to activate the flux valve: turning on the air valve turns on the flux valve; and turning off the air valve turns off the flux valve. However, because the flux jets may expel flux for a short period of time after the air jets have stopped expelling air, the air jets can become clogged with flux.

In system 10, controller 18 sends electrical signals to each set of air and flux valves 120, 122, respectively, to separately control when each valve is turned on and off and to control which nozzles 124 receive air and flux. When rails 61 are lowered and hold a properly seated pallet, controller 18 turns on air valve 120 and after a first predetermined amount of time, approximately 1.0 seconds, turns on flux valve 122. Flux is sprayed for a second predetermined amount of time through selected nozzles to apply the thin layer of flux to a PCB loaded in the pallet. Flux station 62 includes an exhaust pipe 130 which allows venting of flux gasses. The second predetermined amount of time may vary depending upon the type of PCB loaded in the pallet, for example, the second predetermined amount of time is about 1.5–2.0 seconds for PCB 36 (FIG. 3), about 1.0–1.5 seconds for PCB 38, and about 0.5–1.0 seconds for PCB 40. After the second predetermined amount of time passes, controller 18 turns off flux valve 122 and waits a third predetermined amount of time for the flux jets to finish expelling flux and for flux in the surrounding air to settle, before turning off air valve 122. As a result, air is continuously expelled from the air jets both before and after flux is expelled from the flux jets to substantially prevent the air jets from becoming clogged with flux. The third predetermined amount of time may also vary with the type of PCB loaded in the pallet, for example, where three nozzles are directed at large PCB 36 and only one nozzle is directed at small PCB 40, it may take less time, for example, about 0.6 seconds, for the three nozzles directed at large PCB 36 to finish expelling flux than the time, for example, about 1.4 seconds, for the one nozzle directed at small PCB 40 to finish expelling flux. Periodically and without a pallet on rails 61, controller 18 causes the air jets to expel short quick bursts of air to purge or clean the air jets which provides additional protection against clogged air jets.

After applying flux, controller 18 sends electrical signals to stepper motor 84 to cause motor 84 to turn the lead screws and raise rails 61 and pallet 28 such that rails 61 are level with guide rails 44. A rail home sensor (not shown) and a rail bottom sensor (not shown) can be used by the controller to determine if rails 61 are in a home or top position or in a bottom or flux position, respectively. The steps of roughly locating the pallet, lowering the rails, spraying flux, and raising the rails are accomplished within the index period.

The next indexed position following the flux station indexed position locates the pallet in convection oven 14. Oven 14 has multiple indexed positions, e.g., thirteen (for clarity, only four 14a, 14b, 14c, and 14d are shown in FIG. 2a), and runs-at a temperature of about 140° C. to slowly preheat a PCB(s) loaded in the pallet to about 105–110° C., before the pallet is indexed into solder station 16. Preheating the PCB enhances the solder wettability of the connection points and also activates the flux just applied to the connection points. Slowly preheating the pallet and PCB to a desired temperature provides a uniform temperature across the PCB and reduces the risk of damage to the PCB if controller 18 prevents chain 22 from indexing for a period of time when an error is detected in system 10. Past systems have used high temperature, e.g., greater than 280° C., infra-red (IR) or convection panels to quickly preheat individual PCBs to about 105–110° C. However, a PCB left between such high temperature panels beyond a short threshold time may be damaged.

Pallets 28 (FIG. 3) can be made from many materials, including hard coated teflon and aluminum. Aluminum is a preferred pallet material because aluminum pallets typically cost less to manufacture and are more easily detected by metal detecting proximity detectors located in other stages of the overall PCB manufacturing system (not shown). Additionally, aluminum is heavier than teflon and may assist in seating the pallets on the datum and expansion pins.

Aside from preheating PCBs loaded in pallets, oven 14 can also cure the glue used to mount some components to the PCBS. This may eliminate a prior glue curing stage (not shown) in the overall PCB manufacturing system (not shown). If the glue curing temperature is higher, e.g., 125° C., than the PCB soldering preheat temperature, e.g., 105–110° C., then oven 14 may need to be run at a higher temperature, e.g., 160° C., in order to cure the glue. Care should be taken that in raising the temperature the PCBs are not damaged and the application of solder to the PCBs in solder station 16 is not adversely affected.

Nitrogen is continuously added, through a nitrogen input mechanism 83 (FIG. 5) activated by controller 18, to oven 14 at a rate of, e.g., 20 cubic feet per minute (cfm), which pushes contaminants out of the oven and provides a nitrogen environment. An oxygen analyzer 85 (FIG. 5) is used by controller 18 to monitor the oven environment, and controller 18 flags an error to the operator if the parts per million (ppm) of oxygen within oven 14 exceeds a predetermined threshold, for example, 100 ppm. The nitrogen environment reduces the possibility of oxides forming on PCB connection points as pallets are indexed through the oven. Additionally, because solder station 16 also has a nitrogen environment, directly connecting the oven to the solder station will not degrade the nitrogen environment of solder station 16.

At the entrance 132 (FIG. 1a) of oven 14, sparging tubes (tubes with multiple holes; not shown in the Figure) above and below entering pallets are used to blow nitrogen at the pallets. A nitrogen containment curtain (not shown) can also be draped across the entrance to prevent contaminants from entering oven 14.

Figure 8A:
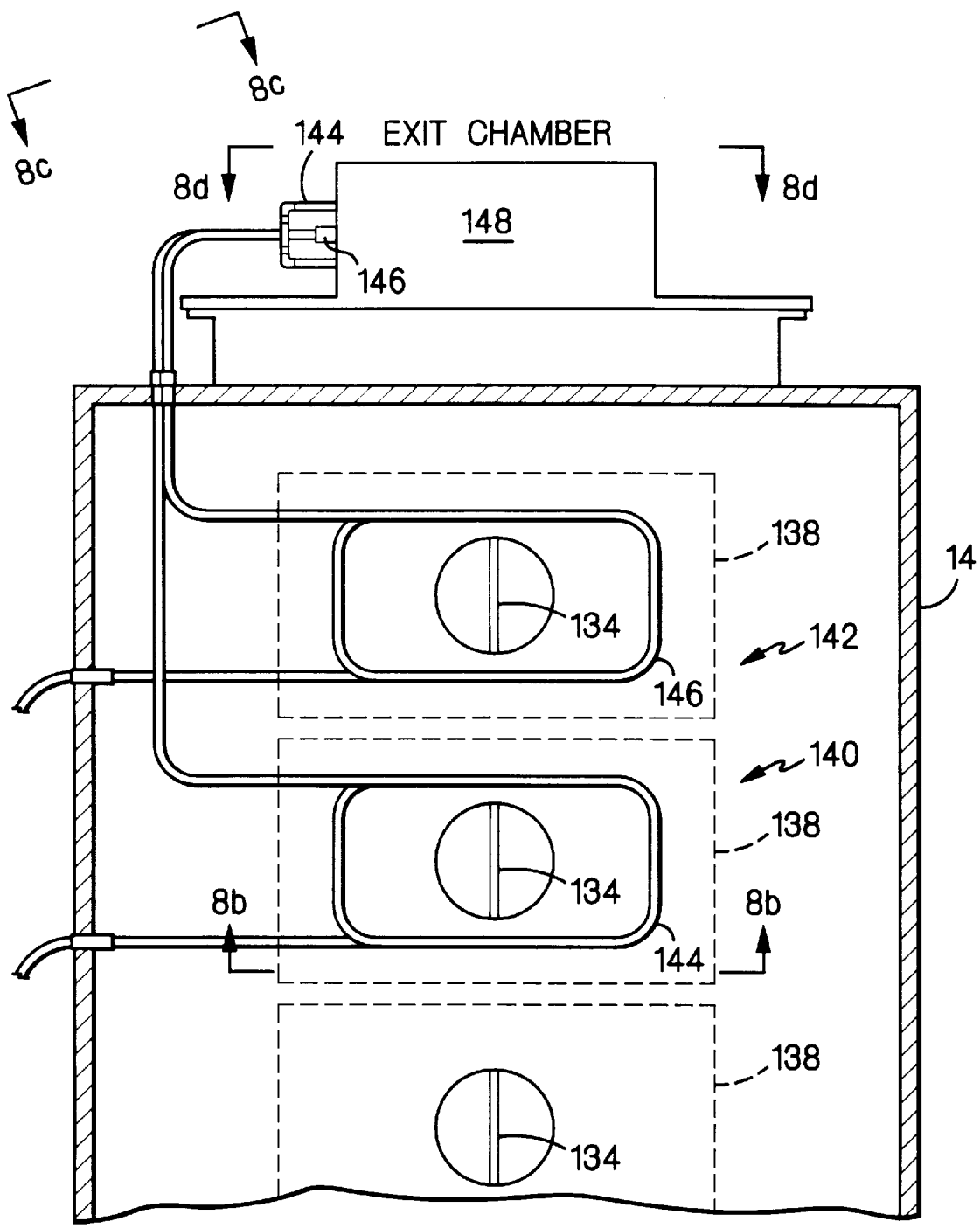
Figure 8B:
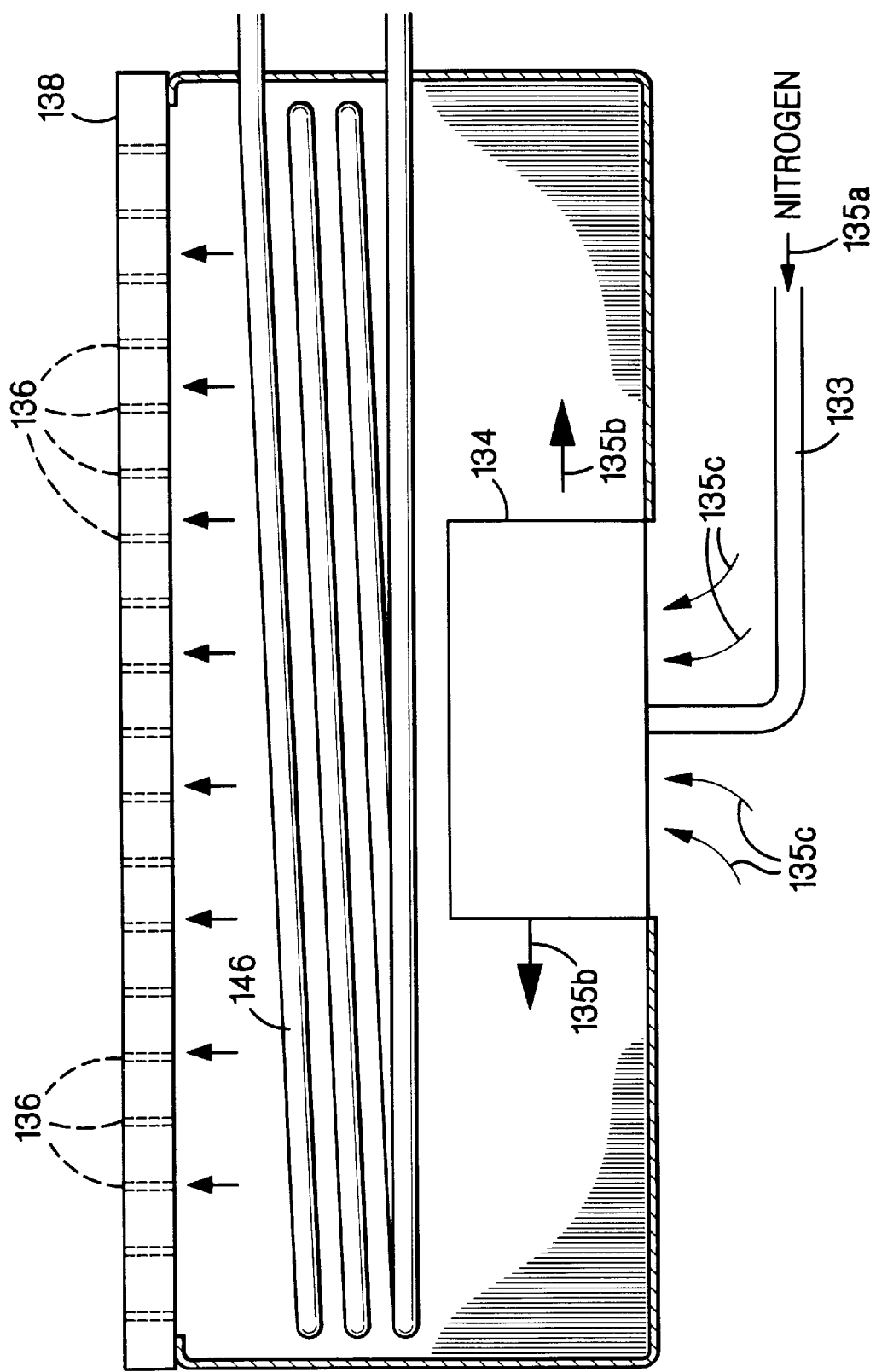

Referring to FIGS. 8a and 8b, several, e.g., ten, heated aluminum plates are distributed within and heat oven 14. Half, e.g., five, of the aluminum plates are supported within oven 14 below (for clarity, only three aluminum plates 138 are shown in dashed outline in FIG. 8a) guide rails 44 (FIG. 2c), which support pallets being indexed through the oven, and half of the aluminum plates (not shown) are supported within oven 14 above guide rails 44. As the pallets are indexed through the thirteen indexed chain positions within oven 14, the pallets pass between the top and bottom heated aluminum plates 138.

On a side of each aluminum plate 138 that is opposite to the side facing the pallets, a nitrogen input tube 133 expels (arrow 135a) nitrogen into oven 14 on one side of a fan 134, and fan 134 pushes (arrows 135b) the expelled nitrogen and environmental (i.e., already within the oven) nitrogen (arrows 135c) against aluminum plate 138. Aluminum plate 138 has many small vertical holes 136 through which the nitrogen passes and becomes heated. Holes 136 in aluminum plate 138 provide a steady, even flow of warm nitrogen between guide rails 44 and, hence, against pallets on those rails.

Figure 8C:
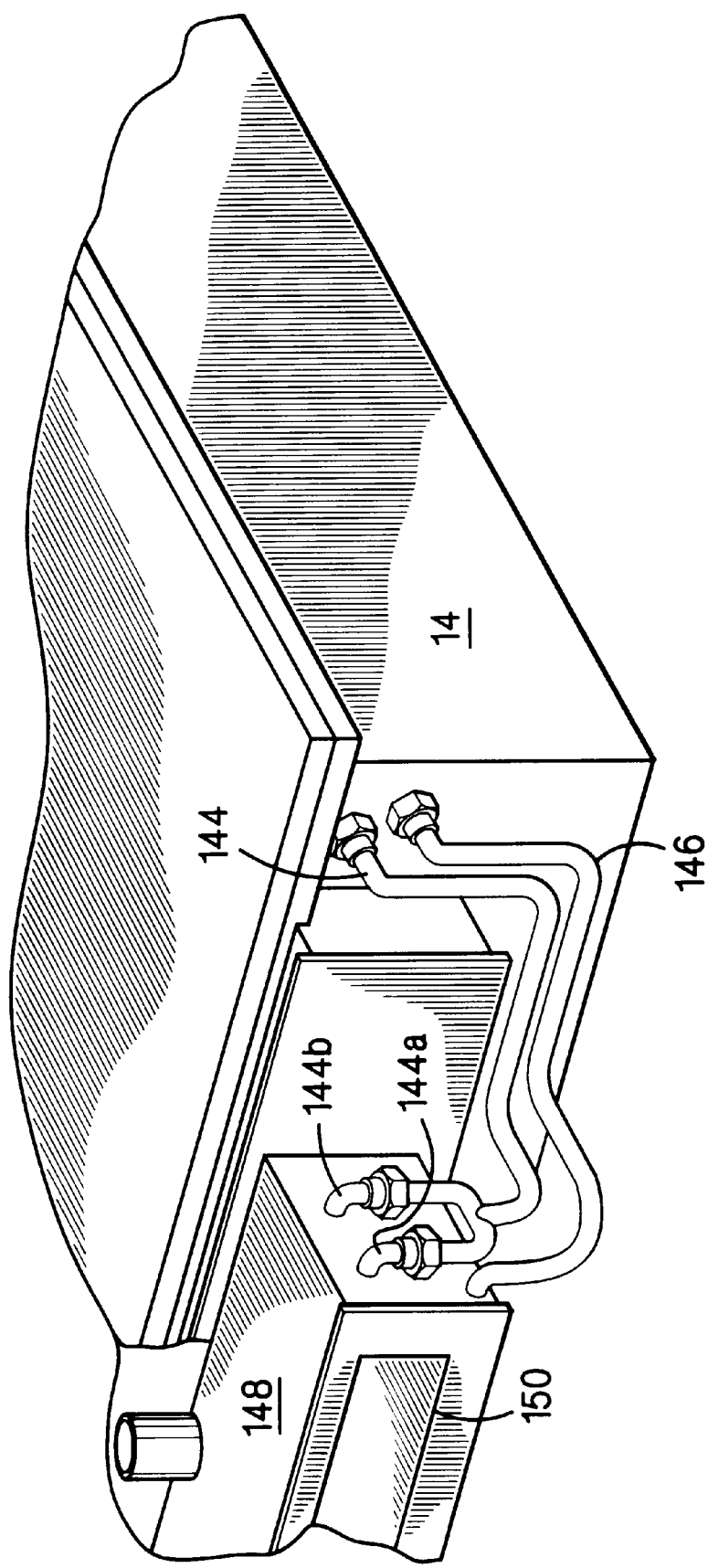
Figure 8D:
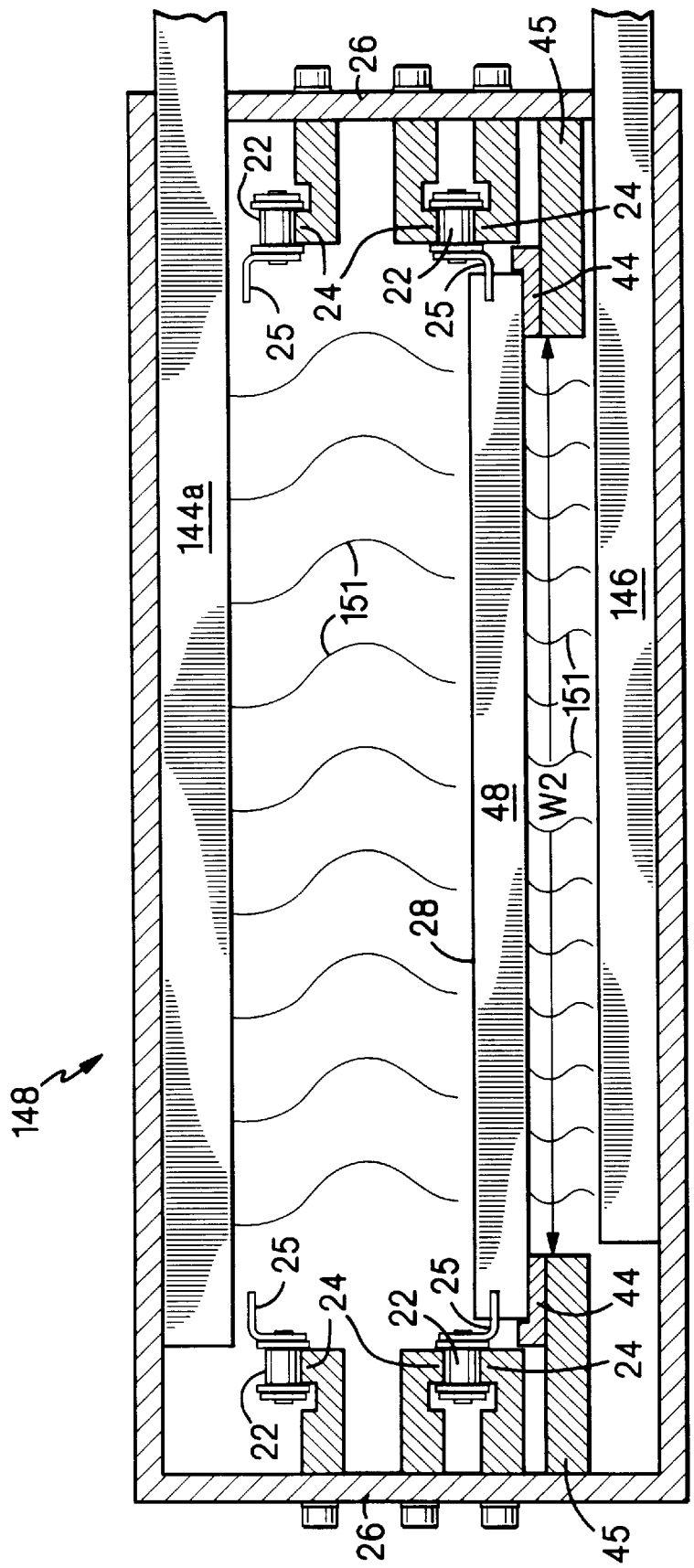

Additionally, underneath the two aluminum plates 138 closest to an oven exit chamber 148, fan 134 pushes nitrogen past tubes 144, 146, filled with nitrogen, to heat the nitrogen in the tubes. Referring also to FIGS. 8c and 8d, tubes 144, 146 are then passed to oven exit chamber 148 where tube 144 is separated into two sparging tubes 144a, 144b (tubes with multiple holes) which are extended across a top of exit chamber 148 and where tube 146 becomes a sparging tube and is extended across a bottom of exit chamber 148. Sparging tubes 144a, 144b, and 146 direct (lines 151) the heated nitrogen across a top and a bottom, respectively, of exiting pallets. A nitrogen containment curtain (not shown) may also be draped across exit 150 of exit chamber 148.

In system 10, exit chamber 148 is only one indexed position wide and heated nitrogen is blown across PCBs loaded in pallets to substantially prevent the PCBs from cooling.

Support rails 45 (FIG. 2c) in oven 14 are fixed to flux station 12 within ID station 50 (FIG. 1a) to prevent longitudinal thermal expansion in a direction toward flux station 12, while guide rails 44 in oven 14 are not fixed at oven exit 150,to allow for longitudinal thermal expansion in a direction toward solder station 16. Referring to FIGS. 2a and 9, guide rails 44 in oven 14 are mounted on support rails 45 which include slots 152 through which shoulder screws 154 are anchored to the oven frame. Slots 152 allow support rails 45 and guide rails 44 to thermally expand and contract longitudinally, for example, by as much as about 0.312 inches. Shoulder screws 154 keep the rails on each side of the oven parallel and separated by a set width W2 (FIG. 2c) which insures that guide rails 44 always support pallet edges 35 and 37 and maintain the pallets on a straight path through oven 14.

Figure 10B:
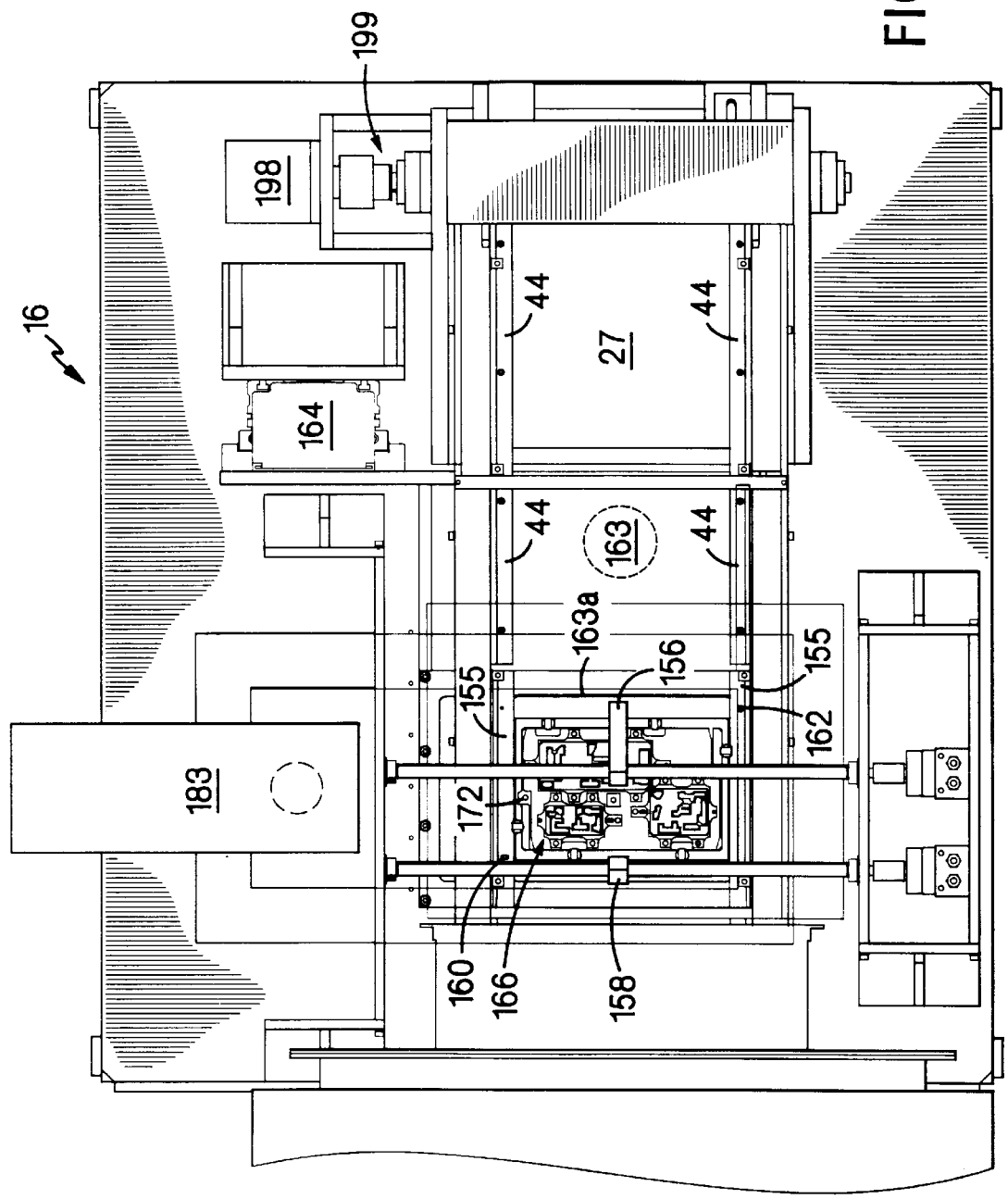

Referring to FIGS. 10a and 10b, from exit chamber 148, the pallet 28 is indexed onto solder rails 155 of solder station 16. A stopper arm 156 and a pusher arm 158 operate to roughly locate the pallet, as discussed above with respect to stopper arm 64 (FIG. 6a) and pusher arm 66 of flux unit 62, and seating sensors 160, 162 are used by controller 18 to determine the proper seating of the pallet on solder rails 155, similar to the use of seating sensors 80, 82 (FIG. 6b). Solder rails 155 are mechanically coupled to a rail table 163 having an aperture 163a. Rail table 163 is mechanically coupled to a lead screw (not shown) which is driven by a stepper motor 164, similar to stepper motor 84 (FIG. 6b). Controller 18 uses motor 164 to lower solder rails 155, and, hence, the pallet, toward a stainless steel solder fountain 166 and to raise solder rails 155 away from solder fountain 166. A datum pin 170 and an expansion pin 172 are press fit into and extend above solder fountain 166 and are used to precisely locate the pallet, and are similar to datum pin 94 and expansion pin 96 (FIG. 6*b*). A nitrogen input mechanism 161 (FIG. 5), controlled by controller 18, provides nitrogen to two sparging tubes 157, 159 (for clarity, show only in FIG. 10*a*) which extend across and above the solder fountain and expel nitrogen at a rate of, e.g., about 30 cfm, toward solder fountain 166.

When rail table 163 and, hence, solder rails 155 are lowered to a predetermined distance above solder fountain 166, if seating sensors 160, 162 indicate an improper seating of the pallet, controller 18 automatically causes stepper motor 164 to raise solder rails 155 to prevent a PCB(s) in the pallet from being damaged. Controller 18 also flags an error, through control panel 60 (FIG. 5), to the operator. Controller 18 may automatically prevent chains 22 from indexing and re-lower solder rails 155 or the operator, through control panel 60 and controller 18, may manually prevent chains 22 from indexing and re-lower solder rails 155. Alternatively, the PCB loaded in the pallet can be considered a reject.

Figure 10C:
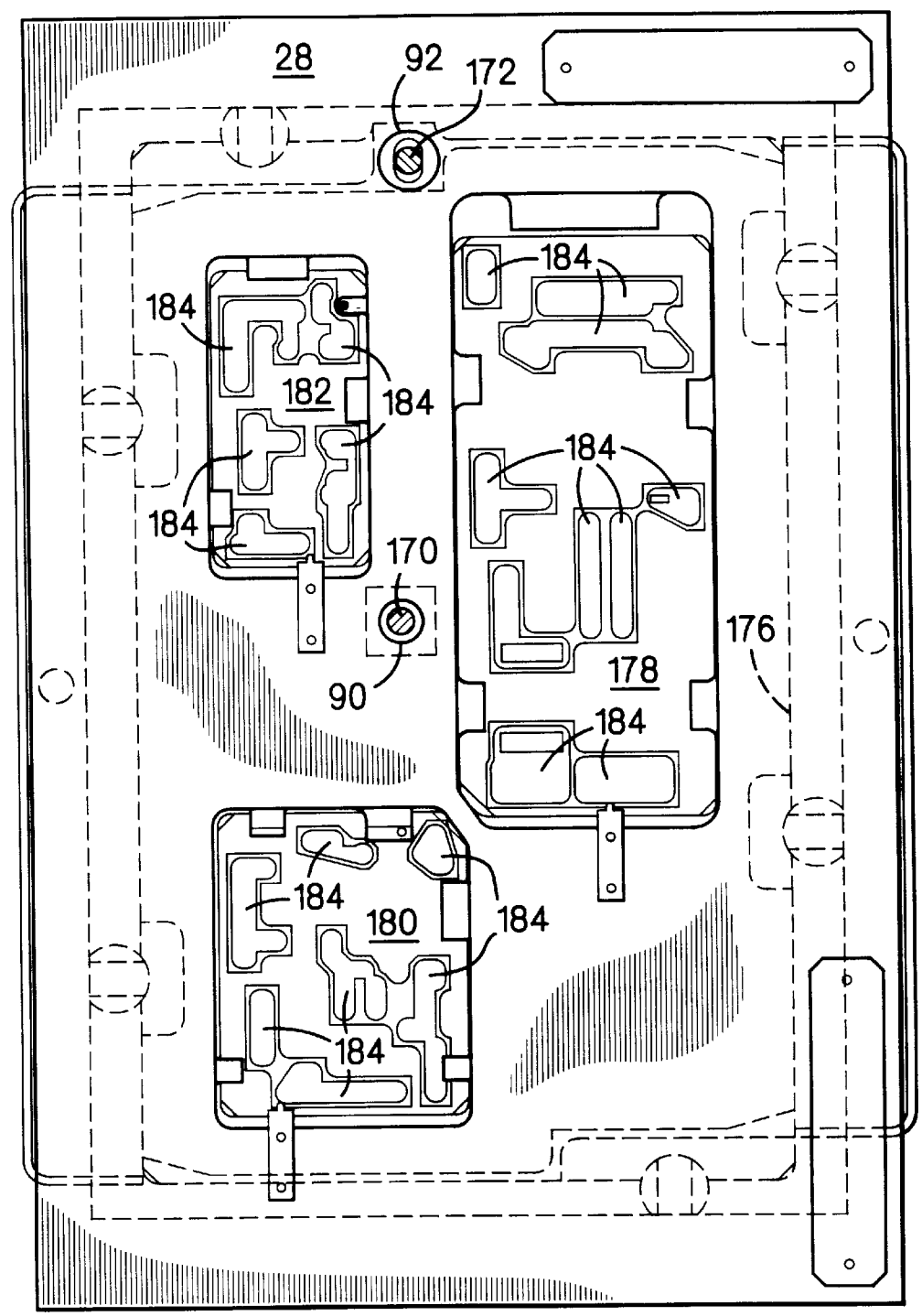
FIG. 10c is a top view of a pallet not loaded with PCBs over a solder fountain.
Figure 10D:
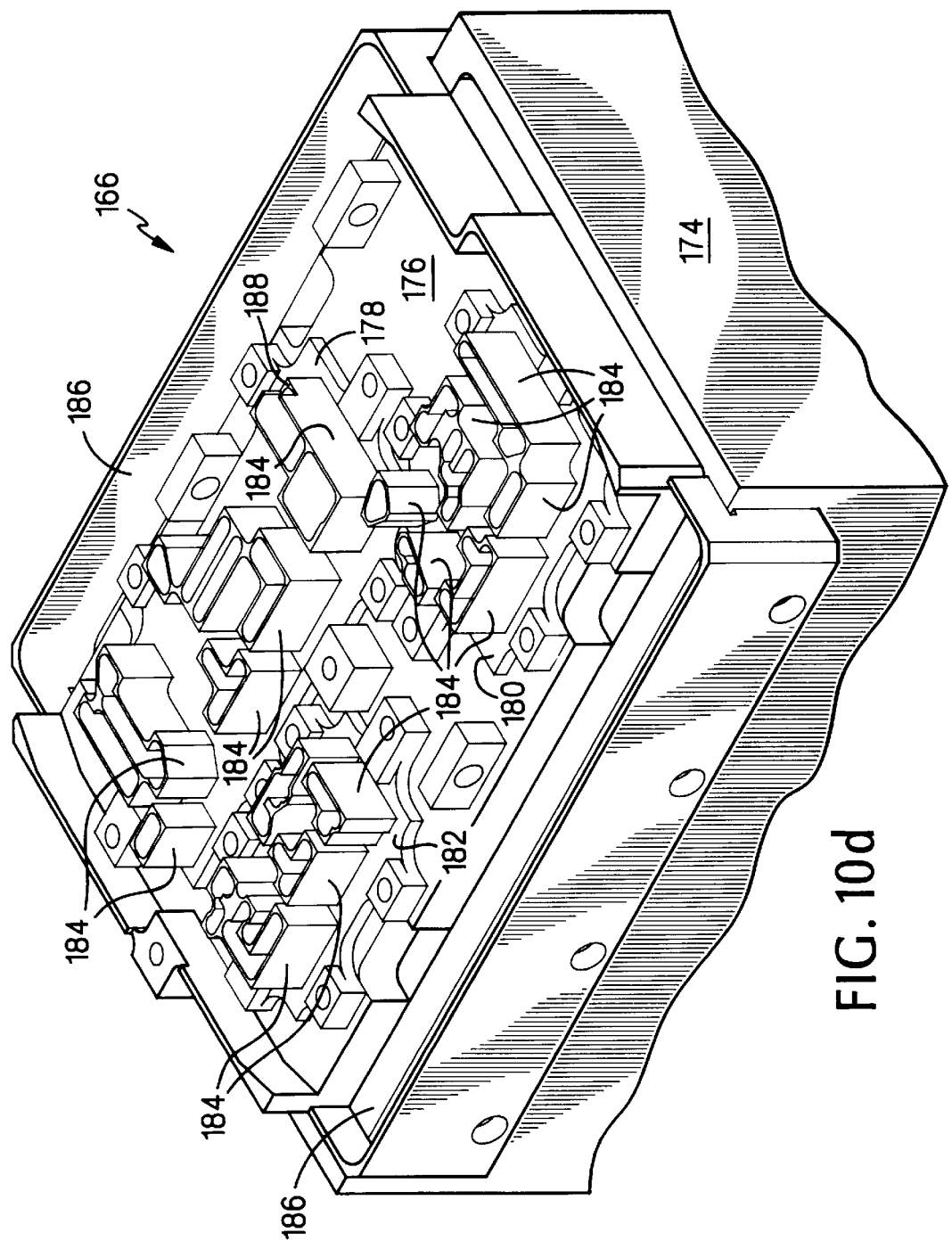
FIG. 10d is a perspective view of a solder fountain.

Referring to FIGS. 10*c* and 10*d* (for clarity, pins 170, 172 are not shown in FIG. 10*d*), solder fountain 166 includes a solder manifold 174 (i.e., main solder chimney) filled with solder (not shown) and a solder well plate 176. Solder well plate 176 includes modular solder wells 178, 180, and 182 which correspond to PCBs 36, 38, 40 (FIG. 3). The modular solder wells are mounted over apertures (not shown) in solder well plate 176. These mounted modular solder wells can be replaced with redesigned modular solder wells. For instance, if a PCB is redesigned and the locations of connection points are changed, a redesigned modular solder well corresponding to the redesigned PCB can mounted to the solder well plate in place of the existing modular solder well.

Each modular solder well 178, 180, 182 includes multiple solder chimneys 184 which correspond precisely to PCB areas having connection points to be soldered. A heater 185 (FIG. 5) heats the solder within solder manifold 174 such that the solder flows freely. Each solder chimney 184 provides an open, unrestricted passageway (P, FIG. 11*c*) from solder manifold 174 to a top of the solder chimneys 184 to allow for the flow of solder.

Pumping nitrogen into the solder fountain reduces the amount of contaminants, e.g., oxygen, and, therefore, prevents the flowing solder from oxidizing. An oxygen analyzer 187 (FIG. 5) is used by controller 18 to monitor the parts per million (ppm) of oxygen in solder station 16. Controller 18 flags an error to the operator through control screen 60 if the level of oxygen exceeds a predetermined threshold, e.g., 100 ppm.

Figure 11A:
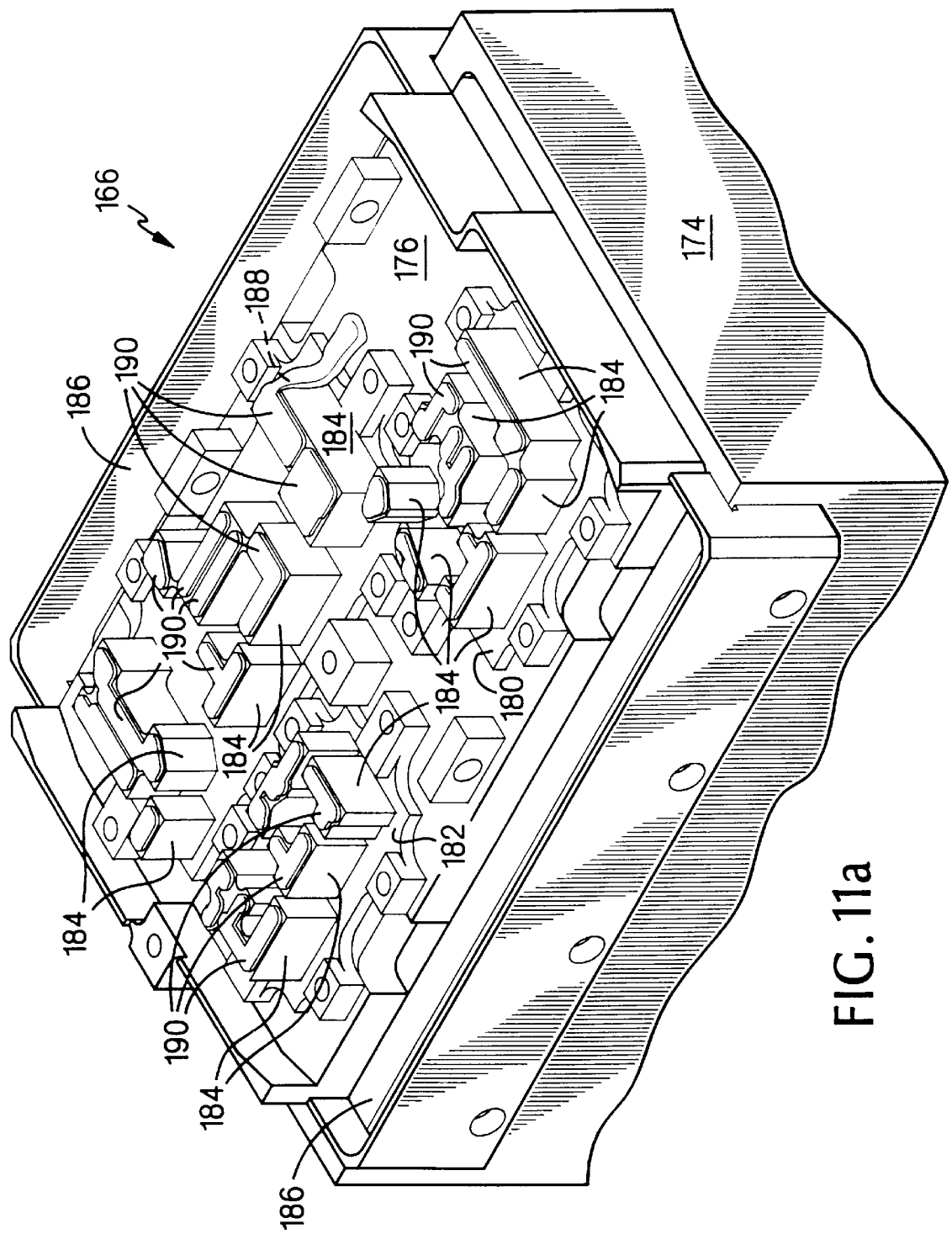
FIG. 11a is a perspective view of a solder fountain with top surfaces of molten solder columns extending above solder chimneys.
Figure 11B:
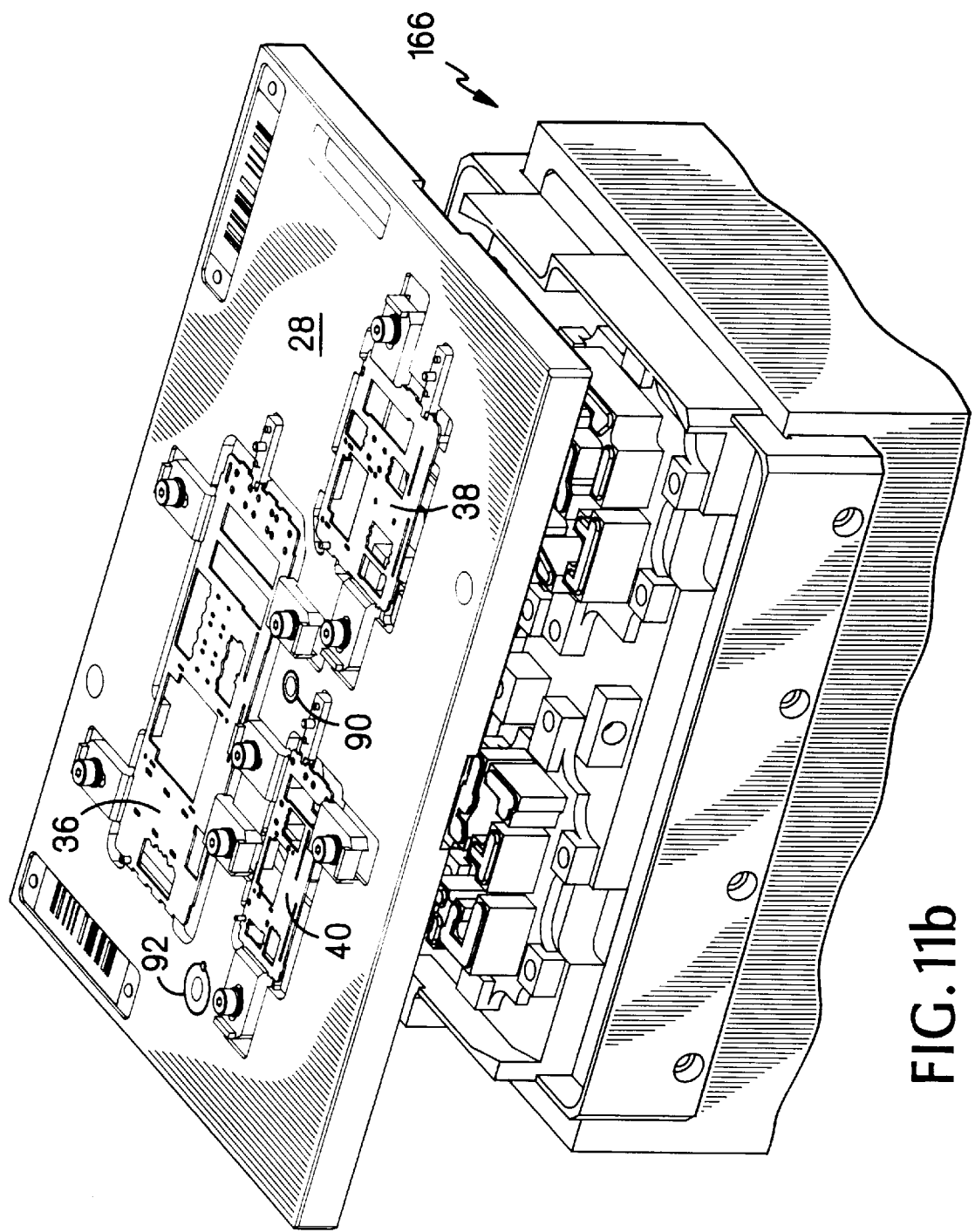
Figure 11C:
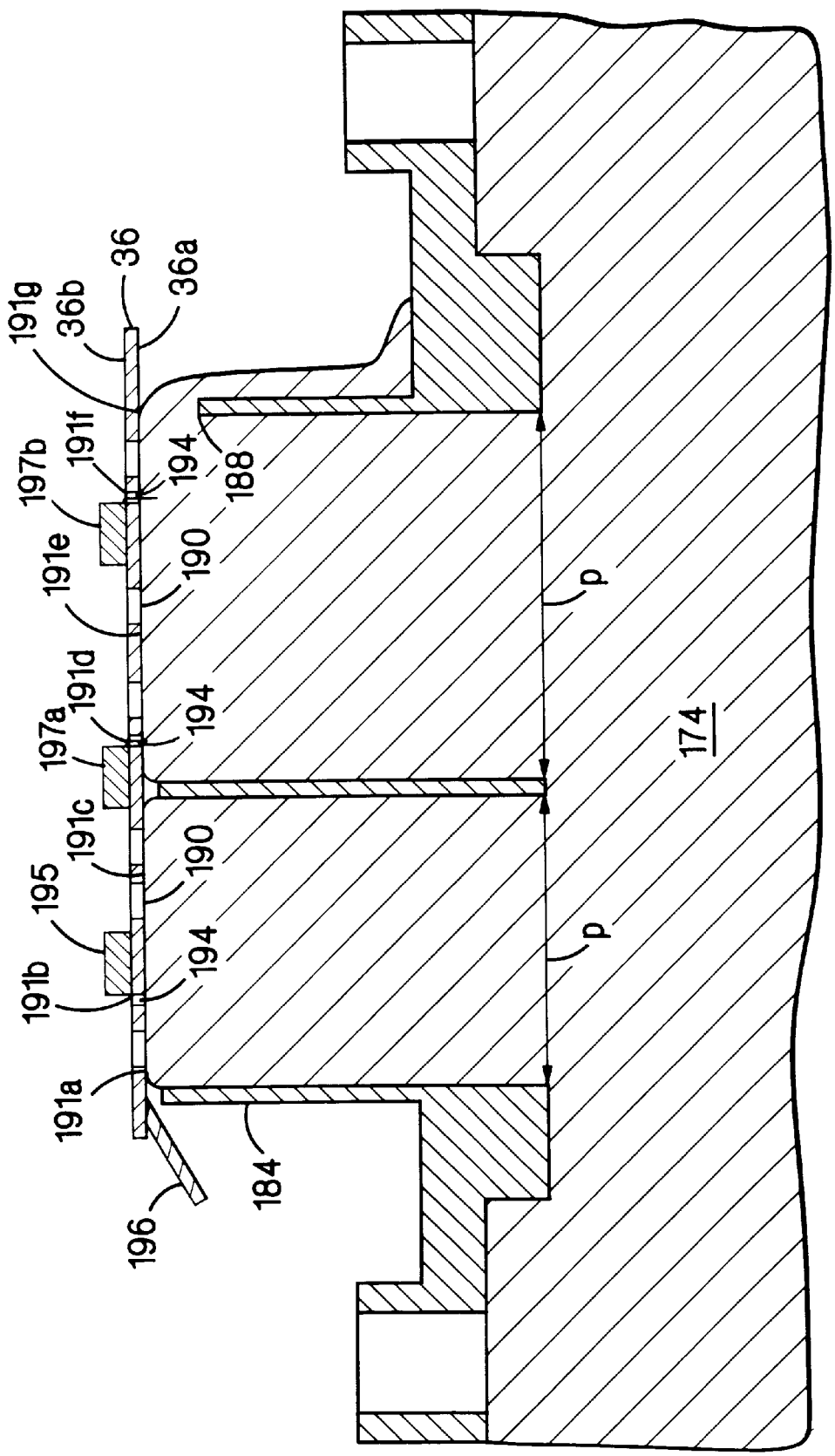
FIG. 11c is a cross-sectional view of a PCB in contact with top surfaces of solder columns extended above two solder chimneys.

Referring to FIGS. 11*a*–11*c* (pins 170, 172 are not shown in FIG. 11*a* and PCBs 36, 38, and 40 are shown without mounted components in FIG. 11*b*), when a pallet 28 is lowered on solder rails 155 (not shown), controller 18 sends electrical signals to pump 183 (FIG. 10*b*) to cause pump 183 to pump solder from solder manifold 174 through chimneys 184 at a soldering pump speed suitable to form stable surfaces 190 on the tops of molten solder columns passing through solder chimneys 184. The pump speed depends upon the size and characteristics of the PCB being soldered, for example, the soldering pump speed for PCB 36 is, for example, approximately 80% of pump capacity, while the soldering pump speed for PCB 40 is, for example, approximately 78% of pump capacity. The areas of a PCB having connection points are then brought in contact, for a predetermined amount of time, e.g., about 5.5–5.7 seconds, with top surface 190. The solder wets to the fluxed and pre-tinned (i.e., pre-treated) connection points between the PCB and components (not shown) mounted on the PCB.

Referring to FIG. 11*c*, when areas of PCB 36 are brought in contact with top surfaces 190, the solder wets to pre-treated connection points 191*a*–191*g*. Those connection points which lie directly over a chimney are soldered whereas those which do not lie above a chimney are not: thus, connection point 191*a* is precisely soldered while an adjacent, extended component, e.g., a single turn transformer winding 196, is not. The connection points can lie flush with a bottom side 36*a* of PCB 36, such as 191*a*, 191*c*, 191*e*, and 191*g*, or the connection points can lie on a top surface 36*b* of PCB 36 and adjacent to through-holes 194 in PCB 36. For instance, a surface mount component 195, e.g., a capacitor, has a connection point 191*b* on top surface 36*b* and adjacent to through-hole 194. When the bottom surface of PCB 36 is brought in contact with top surface 190, the solder wets to through-hole 194 and to connection point 191*b*, as described in U.S. patent application Ser. No. 08/225,263, filed Apr. 8, 1994, and assigned to the same assignee as this application and U.S. patent application Ser. No. 08/337,245, filed Nov. 10, 1994, and also assigned to the same assignee as this application. Additionally, connection points 191*d* and 191*f* of components 197*a* and 197*b* are leads which extend through adjacent through-holes 194, and when bottom surface of PCB 36 is brought in contact with top surface 190, the solder wets to connection points 191*d* and 191*f* and through-holes 194. The leads can extend partially into through-hole 194, completely through through-hole 194 and a small distance, e.g., 0.010 inches, beyond bottom surface 36*a*, e.g., connection point 191*d*, or completely through through-hole 194 and significantly, e.g., 0.10 inches, beyond bottom surface 36*a*, e.g., connection point 191*f*.

One type of solder fountain provides small inlets at a bottom of solder chimneys between the solder manifold and the chimneys. The flow of solder through these inlets may disrupt the top surface of the molten column of solder passing through the chimneys, and, as a result, vibrating or unstable top surfaces may apply solder beyond the PCB areas containing connection points when the PCB is brought in contact with the top surfaces.

Stable top surfaces 190 allow connection points in precise locations to be soldered. The unrestricted passageways, P, between solder manifold 174 and the tops of chimneys 184 may avoid the disruption that may be caused by the flow of solder through inlets in the bottom of the chimneys. Additionally, solder fountain 166 is heavy, e.g., approximately 160–200 lbs, which tends to dampen vibrations in system 10 and substantially prevent the vibrations from passing through solder fountain 166 and disrupting the stable top surfaces 190 of the molten solder columns passing through the chimneys. Solder fountain 166 is also leveled, to approximately 0.005 inches or better, with a precision grade level to insure that the stable top surfaces 190 are also level.

Stepper motor 164 (FIG. 10*b*), like stepper motor 84 (FIG. 6*b*), brings solder rails 155 to a predetermined height with an accuracy of approximately ±0.001 inches. Using pump speed, solder temperature, and solder level, controller 18 can estimate the height of top surfaces 190 above chimneys 184. The solder pump preferably includes a closed loop rotation per minute (rpm) controlled motor system which precisely maintains a selected motor speed. Through control panel 60 (FIG. 5), the operator selects a pump speed and, in response, controller 18 sends an electrical signal to a motor controller (not shown) which corresponds to the selected pump speed. The motor controller uses the electrical signal to set the motor rpm to the desired level and uses an rpm sensor (not shown) to detect the actual speed of the motor. The motor uses the detected actual motor speed to maintain the motor speed at the desired level.

Instead of estimating the height of top surfaces 190, a method for accurately determining the height to which solder rails 155 should be lowered begins by loading a high temperature glass plate, e.g., neoceran, into one or more of the apertures in a pallet. The pallet is then placed on solder rails 155 and rails 155 are lowered until the operator visually detects that the glass plate has come in contact with top surfaces 190 and a consistent displacement of solder is detected across the glass plate at the location of each chimney. A teach button on control panel 60 (FIG. 5) can then be activated by the operator to set the height to which controller 18 will cause stepper motor 164 to bring rails 155.

The height to which rails 155 are brought and the pump speed of the pump may vary with the type of PCB loaded in the pallet. For example, small PCBs, e.g., PCB 40, often use modular wells, e.g., modular well 182, with thicker walled, smaller chimneys 184. The small amount of solder passing through thick walled, small chimneys may heat the chimneys less than the larger amount of solder passing through thinner walled, larger chimneys, e.g., modular well 178. Consequently, the pump speed may have to be increased to pass the solder through these smaller chimneys and achieve the same top surface 190 height. The operator can manually or controller 18 can automatically set three different pump speeds depending upon which PCB is loaded in the pallet.

After a PCB in a pallet has been soldered and solder rails 155 raise the pallet, or when solder rails 155 do not hold a pallet, controller 18 (FIG. 5) sends electrical signals to a solder pump 183 (FIGS. 5 and 10b) to cause solder pump 183 to pump solder from solder manifold 174 through solder chimneys 184 at an overflow rate, e.g., 85% of pump capacity, or to clean out the solder chimneys, controller 18 periodically sends electrical signals to solder pump 13 causing solder pump 183 to pump solder from solder manifold 174 through solder chimneys 184 at a purge rate, e.g., 90–95% of pump capacity. The solder which overflows the chimneys is caught by weirs 186 and recirculated to solder manifold 174.

The flowing, heated solder heats solder well plate 176 and chimneys 184 and also heats the environmental nitrogen. The solder contained within solder manifold 174 provides a certain heat mass, and the larger this mass, the less likely it will be that heat transferred to the solder well plate, chimneys, and environmental nitrogen will affect the overall temperature of the solder. To direct the overflow of solder and prevent undirected overflow paths from applying solder to undesired areas of the PCB, overflow indentations 188 (FIGS. 10d, 11c, and 11c) can be machined into one or more of the chimneys (for clarity, only one is shown).

After a certain number of pallets have passed through system 10, controller 18 detects the level of solder in manifold 174 with, e.g., a retroreflective solder level sensor 192 (FIG. 10a) or a floating solder level sensor (not shown). When the level of solder is below a threshold level (determined by the placement of solder level sensor 192) controller 18 sends electrical signals to solder feed unit 20 (FIG. 1b) to cause solder feed unit to add solder to solder station 16.

In a partially loaded system 10 (i.e., only three pallets are shown within system 10 in FIG. 2a), controller 18 causes the procedures at flux unit 62 and solder station 16 to be executed only when a pallet with a loaded PCB is located at that station. When system 10 is fully loaded (i.e., one pallet with a loaded PCB is located between each pair of flights), controller 18 causes the procedures at flux unit 62 and solder station 16 to be executed during each index period.

Other embodiments are within the scope of the following claims.

For example, although controller 18 was described as providing different flux spray times and different solder pump speeds for the three different types of PCBs which may be loaded in a pallet, a single flux spray time and a single solder pump speed may be sufficient for all three PCB types. If so, two or all three types of PCBs may be loaded at one time in a pallet as the pallet is passed through system 10. Similarly, the pallet can be designed to hold one PCB or one or more of the same type of PCB.

Controller 18 may include a central controller electrically connected to processing station sub-controllers, for instance, identification station 50 (FIG. 1b), flux unit 62, oven 14, and solder station 16, may each include a sub-controller specifically designed to control the operation of the station. The central controller monitors the operation of the entire system and coordinates the operation of the sub-controllers.

A motor 198 (FIG. 10b) which drives chains 22 can include a slip clutch 199, e.g., a torque limiter clutch. With a slip clutch, if chains 22 are prevented from indexing, for instance, by a jammed pallet, the clutch slips and, as a backup, motor electronics limit the current to the motor to prevent the motor from forcing chains 22 to index which may damage chains 22, system 10, or a jammed pallet. Controller 18 can monitor chain movement by determining whether a flight 25 periodically passes home sensors 23 (FIG. 2a). If flights are not detected within a predetermined amount of time, then controller 18 flags an error to the operator.

The walls of chimneys 184 can be machined to change the shape of the chimneys and the wall thickness. This may be required for minor specification changes or if solder is not being properly applied to desired PCB areas. For more significant specification changes, a modular well 178, 180, or 182 (FIG. 10d) can be removed from well plate 176 and replaced with a new modular well reflecting the specification changes. Additionally, a modular well corresponding to a different PCB type altogether may replace one of the existing modular wells attached to well plate 176. Similarly, well plate 176 can be replaced with a new well plate having different sized apertures, possibly in different locations, for receiving different sized modular wells. Of course, such changes may required similar changes to pallet 28.

Identification station 50 could include a bar code scanner (not shown) for reading a bar code 200 (FIG. 3) on pallet 28 and for notifying controller 18 of the results of the bar code scan. Controller 18 could then use the results of the bar code scan to determine using, for example, a table look up, which PCB or PCBs are loaded in pallet 28. Bar codes allow controller 18 to keep track of individual pallets.

Many sensors can be placed throughout system 10 and monitored by controller 18 to detect error conditions. For example, a solder temperature sensor 202 (FIG. 10a) can be monitored by controller 18 to prevent controller 18 from activating the solder pump, and possibly damaging the solder pump, when the solder is below a first predetermined temperature, e.g., 230° C. Similarly, solder temperature sensor 202 can be monitored by controller 18 to prevent controller 18 from activating the solder pump, and possibly damaging a PCB loaded in a pallet on lowered solder rails 155, when the solder temperature is above a second predetermined temperature, e.g., 270° C.

Upon the detection of an error condition, controller 18 can execute automatic procedures or wait for instructions from the operator. When controller 18 or an operator prevents chains 22 from indexing, controller 18 can automatically or the operator can manually reduce the temperature at which oven 14 is running to further reduce the possibility that PCBs being indexed through oven 14 will be heat damaged. If controller 18 is connected to conveyor belt 46 (FIG. 1*b*), and controller 18 detects an error, controller 18 can automatically stop conveyor belt 46 and prevent new pallets from entering system 10. Aside from notifying the operator of errors through control panel 60 (FIG. 5), controller 18 could notify the operator through alarm lights or bells.

What is claimed is:

1. A flux unit for applying flux to precise areas of printed circuit boards, comprising a rough part locator that roughly locates a printed circuit board within the flux unit, and a precise part locator that precisely locates the printed circuit board.

2. The flux unit of claim 1, wherein the rough part locator includes a stopper arm having an end that provides a datum point, and a pusher arm for pushing the part against the stopper arm.

3. The flux unit of claim 1, wherein the precise part locator includes a datum bushing and a slotted bushing on the printed circuit board, and a datum pin and an expansion pin for respectively engaging the datum bushing and the slotted bushing.

4. The flux unit of claim 1, further comprising a guide rail for supporting the printed circuit board, and a mechanism for raising and lowering the guide rail.

* * * * *